United States Patent [19]
Yamada et al.

[11] Patent Number: 5,800,631
[45] Date of Patent: Sep. 1, 1998

[54] SOLAR CELL MODULE HAVING A SPECIFIC BACK SIDE COVERING MATERIAL AND A PROCESS FOR THE PRODUCTION OF SAID SOLAR CELL MODULE

[75] Inventors: Satoru Yamada, Tsuzuki-gun; Takahiro Mori, Ikoma; Ichiro Kataoka; Hidenori Shiotsuka, both of Tsuzuki-gun; Ayako Komori, Nara, all of Japan

[73] Assignee: Canon Kabushiki Kaisha, Tokyo, Japan

[21] Appl. No.: 703,101

[22] Filed: Aug. 26, 1996

[30] Foreign Application Priority Data

| Aug. 24, 1995 | [JP] | Japan | 7-216332 |
| Jan. 10, 1996 | [JP] | Japan | 8-018284 |
| Jan. 19, 1996 | [JP] | Japan | 8-024846 |

[51] Int. Cl.$^6$ .................................. H01L 31/048
[52] U.S. Cl. .................. 136/251; 136/259; 136/291; 257/433; 52/173.3; 156/285; 156/289; 438/64; 438/66

[58] Field of Search ................. 136/251, 259, 136/291; 257/433; 52/173.3; 438/64, 66–67; 156/285, 289

[56] References Cited

U.S. PATENT DOCUMENTS 4,544,798  10/1985  Cannella ........................... 136/251

Primary Examiner—Nam Nguyen
Attorney, Agent, or Firm—Fitzpatrick Cella Harper & Scinto

[57] ABSTRACT

A solar cell module which comprises a stacked body including a photovoltaic element interposed between a front side covering material and a back side covering material having a foamed material layer, wherein said foamed material layer is formed by foaming an unfoamed material during the formation of said stacked body. A building construction member having said solar cell module is also described.

40 Claims, 13 Drawing Sheets

SOLAR CELL MODULE HAVING A SPECIFIC BACK SIDE COVERING MATERIAL AND A PROCESS FOR THE PRODUCTION OF SAID SOLAR CELL MODULE

BACKGROUND OF THE INVENTION

1. Field of the Invention

The present invention relates to an improved, highly reliable solar cell module. More particularly, the present invention relates to an improved, highly reliable solar cell module comprising a photovoltaic element having a photoactive semiconductor layer as a photoelectric conversion member enclosed by a front surface covering material "surface covering member" and a back side covering material a "back side covering member" made of a specific foamed material, which is hardly deteriorated by continuous irradiation of light, excels in cushioning property, and is hardly deformed even upon application of an external pressure thereon.

2. Related Background Art

Recently, a number of thin film solar cells have been proposed. A typical one of these thin film solar cells is an amorphous silicon (a-Si) thin film solar cell. As for the a-Si thin film solar cell, there is known a configuration in which an a-Si semiconductor film functioning as a photoelectric conversion element is disposed on an electrically conductive substrate and a transparent conductive layer is disposed on said electrically conductive substrate. The thin film solar cell thus configured has advantages in that it excels in flexibility and is light weight.

There is known a solar cell module wherein a plurality of such thin film solar cells having the above advantages are integrated in series connection into a module and the opposite faces of the module are covered by a front surface covering material and a back side covering material each comprising an organic resin material, which has advantages in that it can be bent as desired, is portable, and can be used outdoors.

However, such solar cell module has such drawbacks as will be described in the following. That is, when the solar cell module is repeatedly bent, a problem is liable to entail in that the electric connection portions present at the bent portions are sometimes broken. In addition, as for the solar cell module, the covering material constituted by the organic resin material is usually very thin in order to be of light weight so that it can be easily carried. Because of this, the solar cell module is insufficient in terms of physical strength, and therefore, when the solar cell module is placed on an uneven place such as sandy plain or beach and a person steps thereon, problems are liable to entail in that the solar cell contained in the solar cell module is damaged, thereby losing its photoelectric conversion performance or/and the covering material is punctured to cause the generation of a leakage current.

In order to prevent the solar cell contained in the solar cell module from being damaged by such external pressure caused when a person steps thereon, there is known a configuration wherein the material covering the rear side of the solar cell is a foamed material. The solar cell module thus configured is capable of preventing the solar cell contained therein from being damaged by external pressure applied on the solar cell module when the solar cell module is placed on an uneven place as above described and a person steps thereon. As the solar cell module having such configuration, there is known a light weight solar cell module which can float on water.

Now, in the case of an a-Si solar cell (an a-Si photovoltaic element), the photoelectric conversion efficiency is reduced due to the so-called Staebler-Wronski deterioration to a certain level but is recovered by heat annealing which occurs during continuous outdoor use. And the reduction in the photoelectric conversion efficiency of the a-Si solar cell is slight at a high temperature. Therefore, the a-Si solar cell does not require a complicated cooling structure such as employed in the case of configuring a crystalline photovoltaic element into a module.

As for the a-Si solar cell, even when its photoelectric conversion member is of a thickness of as little as several microns, it exhibits a desirable photoelectric conversion performance. Therefore, the production of an a-Si solar cell module can be conducted by disposing a given a-Si solar cell on an appropriate heat resistant support member. Exemplary support members may include steel plates, metal plated-steel plates, stainless steel plate, and resin films composed of a heat resistant resin such as polyimide. The a-Si solar cell module thus produced excels in flexibility, and therefore, the solar cell (the photovoltaic element) containing the a-Si solar cell element can be prevented from suffering a damage without using a rigid glass plate (having a thickness of 3 mm, for instance).

Particularly, in the case of producing a solar cell module using an a-Si solar cell (or an a-Si photovoltaic element), various covering configurations can be optionally employed. For instance, it is possible to cover the a-Si solar cell by a plastic film without using a glass plate. In the case of adding rigidity to the solar cell module, it is possible to use an appropriate steel plate. The solar cell module having a steel plate or the like as the support member and having no glass plate on the surface thereof is satisfactory in terms of having a combination of rigidity, fire proofing, incombustibility, and economy. And this solar cell module has a structure similar to that of a metallic roof of a building. Therefore, the solar cell module can be easily placed on such roof without using a complicated member and without requiring particular application work.

However, the steel plate has a high thermal conductivity of 0.5 J/cm.s.K and therefore, it releases heat to the open air or through the member fixing it to the roof. Because of this, the steel plate is insufficient for the a-Si solar cell to be heat-annealed during use of the solar cell module in the outdoors. In order to eliminate this problem, it is desired to dispose a foamed material having a thermal conductivity of about $4\times10^{-4}$ J/cm.s.K, which is about 1000 times lower than that of the steel plate, between the a-Si solar cell and the steel plate.

Depending upon the use environment and the installation manner, in general, in the case of a solar cell module in which a foamed material having a thermal conductivity of $1\times10^{-3}$ J/cm.s.K or less is used, when the solar cell module is placed on a roof of a building, the temperature of the solar cell contained therein is increased as much as about 10° to 30° C. over that in the case of a solar cell not having foamed material.

In general, as for a solar cell module which is free of this problem, a configuration having a heat insulator formed by laminating the foamed material to the rear face of the support member so that the support member and an insulating member are positioned between the foamed material and the a-Si solar cell has been considered. However, this configuration is still problematic in that both the heat capacity and the thermal conductivity become great and the improvement provided is slight, i.e., the temperature of the solar cell is increased by only 10° to 20° C.

Besides this, there has been considered a configuration in which the foamed material is disposed between the support member and the insulating material. However, this configuration has a problem in that unless the foamed material has a high heat resistance, the pores present in the foamed material are broken during the process of covering the a-Si solar cell in order to produce the solar cell module. The reason for this is that as the covering process is performed by conducting heat treatment to fuse a filler material and conducting compression treatment to bond the covering material to the solar cell by means of the fused filler material, when the foamed material is intended to bond to the solar cell together with the covering material in the above process, the foamed material is also heated and compressed and as a result, the pores present therein are broken. Especially in the case where the covering process is conducted by way of vacuum lamination, the air contained in the foamed material is released upon conducting the heating treatment and compression treatment and the foamed material is subjected to a vacuum, whereby the foamed material has no pores remaining therein, or the resin constituting the foamed material is fused to convert the foamed material into a state with no pores therein. The material thus resulting from the foamed material never regains its original thickness even if it is cooled.

In this respect, it is difficult to cover the solar cell with the front surface covering material and the back side covering material having the foamed material into a desirable solar cell module at the same time by the above described process.

In order to eliminate the above problems, it has been considered to use a foamed material excelling in heat resistance. But such foamed material is not desirably heat-deformed so as to fill the irregularities present at the solar cell even under high temperature conditions occurring in the covering process. Particularly in this respect, as for a solar cell (a photovoltaic element) used in the production of a solar cell module, wiring is conducted at the rear face thereof in order to make the solar cell module have as large a light receiving face as is possible. Therefore, depending upon the situation, the rear face of the solar cell is provided with a plurality of irregularities in any case. In the case where an already foamed material which has flatness and excels especially in heat resistance is laminated to the uneven rear face of the solar cell, there entail other problems which will be described in the following. That is, in the case where the foamed material is crosslinked, the irregularities present at the rear face of the solar cell cannot be sufficiently filled and therefore, the resulting solar cell module has cavities therein. When this solar cell module having such cavities is subjected to the high temperature and high humidity dew concentration test prescribed in JIS-C-8917, water penetrates the cavities when it is maintained under conditions of high temperature and high humidity, and thereafter, when the solar cell module is cooled to a low temperature, the water penetrated into the cavities is frozen and expands in volume, thereby causing layer separation at the expanded portion.

In order to eliminate the occurrence of the above problems, use of a non-crosslinked foamed material has been considered. However, in this case, there entails a problem in that the foamed material is crushed during the covering process because it is not crosslinked. In order to prevent the foamed material from being crushed, it has been considered to use, as the foamed material, a heat resistant foamed material composed of silicone resin, or polyester resin; especially polyethylene terephthalate or phenol resin, or a foamed material composed of polypropylene which is slightly inferior to the formed foamed material in terms of heat resistance. However, these foamed materials are difficult to heat-deform and therefore, the irregularities of the solar cell cannot be filled as desired by them. In addition, there is a problem in that the foamed materials excelling in heat resistance generally are poor in flexibility. In fact, the foamed materials composed of polyacetal, phenol resin, or polyethylene terephthalate excel in heat resistance but are inferior in flexibility. And in the case of a solar cell module obtained using any of these foamed materials, when it is bent at a curvature of 100 mm, the foamed material suffers from cracking and/or wrinkling so as to be defective in exterior appearance.

Now, as for a foamed material composed of a crosslinked silicone resin, it is considered that the foamed material is satisfactory in flexibility and heat resistance. The present inventors conducted experimental studies of this foamed material. As a result, it was found that the foamed material is crushed at a proportion of about 70% in terms of the layer thickness during the covering process by way of thermo-compression treatment in order to produce the solar cell module.

There is known a solar cell module provided with a steel plate excelling in thermal conductivity as the support member and a heat insulation member comprising a heat resistant foamed material laminated on the outer surface of the steel plate, which can be maintained at a high temperature.

The production of this solar cell module is conducted by preparing a stacked body by conducting the foregoing covering process of laminating a given surface covering material on the light receiving face of a given solar cell (or a given photovoltaic element), and a back side covering material and said steel plate on the rear face of the solar cell, and bonding said foamed material to the steel plate of the resultant stacked body using an adhesive.

As for this solar cell module, because the foamed material is provided through the steel plate excelling in thermal conductivity, there are problems such that the temperature increase of the solar cell during use is small and therefore, desirable heat-annealing does not occur in the solar cell; and the foamed material as the heat insulation member is liable to absorb moisture and therefore, the solar cell module is gradually deteriorated in terms of thermal conductivity as it is repeatedly used outdoors. Further, in the case where the laminate of the foamed material having thermal conductivity is intended to conduct heat during the covering process by way of thermocompression treatment, there entails a problem in that the irregularities present at the solar cell cannot be filled as desired and the resulting solar cell module is inferior, particularly in terms of the flexibility.

Use of a foamed material having flexibility in the covering process can be considered. However, in this case, there entails a problem in that the pores in the foamed material are broken during the covering process. In the case of using a crosslinked foamed material having flexibility, it is expected that the irregularities present at the solar cell would be filled immediately at a stage immediately after the covering process, but in practice, as for the solar cell module obtained in this case, when it is subjected to a temperature cycle test or a temperature and humidity cycle test, there occurs a problem in that the filling state of the irregularities present at the solar cell becomes defective. As for the reason for this, it is considered such that the crosslinked foamed material is merely temporarily heat-deformed during the covering process, and this situation leads to layer separation at the interfacial portion having irregularities due to a stress generated because of changes in the environmental conditions or successive relaxation in the internal stress of the residual foamed material.

When this solar cell module having the above defect in the filling state of the irregularities of the solar cell is practically used, there entails a problem in that water penetrates into the defective portions due to changes in environmental temperature and humidity, wherein the penetrated water is possibly frozen depending upon the use environment, whereby the foregoing layer separation proceeds further.

Now, in order to produce a solar module bonded with a given foamed material, it is necessary to conduct a lamination step of covering a given solar cell (or a given photovoltaic element) with a given surface side covering material and a given insulating material and a step of bonding the foamed material onto the insulating material using an adhesive or the like. In this case, in order for the foamed material to be bonded onto the insulating material without crushing the pores of the foamed material, the bonding step of the foamed material must be conducted at room temperature. Particularly, in the bonding step of the foamed material, application of the adhesive, drying of the adhesive applied, lamination of the foamed material, and curing of the adhesive must be conducted. This sequence is poor in efficiency since numerous steps are necessary to be conducted and it is inferior in productivity since foreign matter such as dust is liable to deposit upon drying of the adhesive. Besides these problems, there are further problems in that the curing of the adhesive must be conducted under pressure conditions, and because of this, it is necessary to use a particular pressing means, and in addition to this, the foamed material is sometimes laminated in an unaligned state. Further, in the case where the adhesive used is of a solvent type, there are problems such that the application thereof must be conducted using a coating booth and for this, it is necessary to use a particular apparatus provided with an exhaust system. On the other hand, in the case where the adhesive is of an aqueous type such as an emulsion type adhesive, there are problems such that it usually takes time for the applied adhesive to dry, and in addition to this, the adhesion of the adhesive is usually insufficient and therefore, the laminated foamed material is liable to separate.

As the foamed material to be laminated, one having a uniform thickness is used while disregarding the irregularities present at the rear face of the solar cell, and therefore, the portions of the laminated foamed material facing the protruded portions of said irregularities are eventually protruded. This is not acceptable in terms of the exterior appearance. Besides this problem, a further problem is liable to entail in that the laminated foamed material itself does not follow the above protruded portions, thereby causing the generation of cavities at the interfacial portion thereof. When the solar cell module having such cavities at the interfacial portion of the layer comprised of the foamed material is subjected to the high temperature and high humidity dew concentration test prescribed in JIS-C-8917, water penetrates into the cavities when it is maintained under conditions of high temperature and high humidity, and thereafter, when the solar cell module is cooled to a low temperature, the water that penetrated the cavities is frozen and expands in volume to cause layer separation at the expanded portion.

Further, as for the solar cell module having the layer comprising the foamed material on the rear side which has been laminated at room temperature as above described, a problem is liable to entail in that the layer comprising the foamed material suffers from a distortion because the foamed material does not have a sufficient heat history. Particularly, for instance, when the solar cell module is subjected to a temperature cycle test or temperature and humidity cycle test, a problem often occurs such that the layer comprising the foamed material is thermally expanded or thermally contracted to curl the solar cell module as a whole. In order to prevent the occurrence of this problem, subjecting the foamed material to heat treatment in advance prior to the practical use thereof has been considered.

In order to solve the foregoing problems, as above described, a process of conducting the lamination of a previously foamed material in the foregoing covering process has been considered. However, in this case, unless the foamed material is highly heat resistant, a problem entails in that the pores in the foamed material are broken during the covering process. Particularly, as the covering process is performed by conducting heat treatment to fuse a filler material and conducting compression treatment to bond the covering material to the solar cell by means of the fused filler material, when the foamed material is intended to bond to the solar cell together with the covering material in the above, the foamed material is also heated and compressed and as a result, the pores present therein are broken. Especially in the case where the covering process is conducted by way of vacuum lamination, the air contained in the foamed material is released upon conducting the heating treatment and compression treatment and the foamed material is subjected to a vacuum, whereby the resulting foamed material has no pores therein, or the resin constituting the foamed material is fused to convert the foamed material into a state with no pores therein. The material thus resulting from the foamed material never returns to a state having the original thickness even if it is cooled. Therefore, it is difficult to cover the solar cell with the front surface covering material and the back side covering material having the foamed material into a desirable solar cell module at the same time by the above described manner.

Incidentally, the present inventors conducted experimental studies by using a crosslinked silicone resin member, which is considered to have flexibility and heat resistance, as the foamed material in the above process. As a result, it was found that the crosslinked silicone resin member is crushed at a proportion of about 70% in terms of the layer thickness during the covering process.

SUMMARY OF THE INVENTION

The present invention has been accomplished as a result of extensive studies by the present inventors in order to solve the problems described in the above.

An object of the present invention to provide an improved, highly reliable solar cell module having a specific structure capable of stably maintaining a photovoltaic element (or a solar cell) enclosed therein without being damaged even when external pressure is applied thereto and without the photovoltaic element being deteriorated in terms of the photoelectric conversion efficiency even upon exposure to light irradiation over a long period of time.

Another object of the present invention is to provide an improved, highly reliable solar cell module having a photovoltaic element (or a solar cell) enclosed by a specific structure provided with a foamed material in a state free of not only unevenness based on the irregularities present in the photovoltaic element but also cavities due to the foamed material while the irregularities present in the photovoltaic element are sufficiently filled and which excels especially in rear face protective ability, and said solar cell module is hardly damaged even when external pressure is applied thereto and the photovoltaic element contained therein is hardly deteriorated in terms of the photoelectric conversion efficiency even upon exposure to light irradiation over a long period of time.

The present invention attains the above objects.

A typical embodiment of the solar cell module according to the present invention comprises a photovoltaic element (or a solar cell) having a photoactive semiconductor layer as a photoelectric conversion member, said photovoltaic element being enclosed by a front surface covering material disposed on the light receiving side of said photovoltaic element and a back side covering material having a foamed material disposed to cover the rear side of said photovoltaic element, wherein said foamed material comprises a stacked body comprising a foamed material and a fiber, or a material comprising a foamed material incorporated with a fiber therein.

The present invention includes a process for the production of said solar cell module, characterized in that during a step of laminating a front surface covering material and a back side covering material to a photovoltaic element (or a solar cell) so as to enclose said photovoltaic element by said front surface covering material and said back side covering material by way of thermocompression treatment, on unfoamed material as a constituent of the back side covering material is foamed to convert said unfoamed material layer into a foamed material layer.

DESCRIPTION OF THE INVENTION AND PREFERRED EMBODIMENTS

Figure 1A:
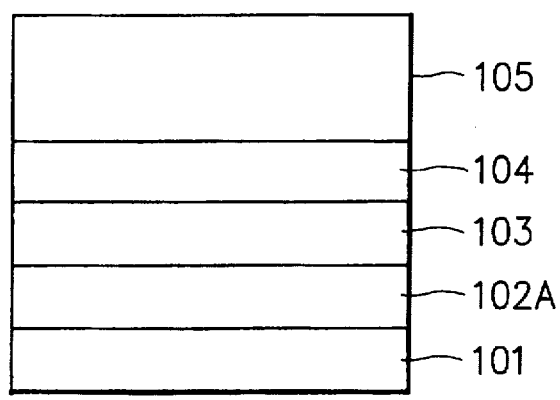
FIGS. 1(A) and 1(B) are schematic cross-sectional views illustrating an example of a solar cell module according to the present invention.

The present invention provides a highly reliable solar cell module having a photovoltaic element (or a solar cell) enclosed by a front surface covering material disposed on the light receiving side of said photovoltaic element and a back side covering material having a foamed material disposed to cover the rear side of said photovoltaic element, characterized in that said back side covering material comprises a specific structure provided with a specific member selected from the group consisting of a stacked body comprising a foamed material and a fiber and a material comprising a foamed material incorporated with a fiber therein (the specific member will be hereinafter referred to as fiber-bearing foamed material member).

In the solar cell module thus constituted according to the present invention, the above described structure (this structure will be hereinafter referred to as back side covering structure) as the back side covering material is in a state free of not only unevenness based on the irregularities present at the rear face of the photovoltaic element but also cavities due to the foamed material, while said irregularities of the photovoltaic element are sufficiently filled and which excels especially in rear face protective ability. Because of this, the solar cell module according to the present invention is hardly damaged even when external pressure is applied thereto, and the photovoltaic element contained therein is hardly deteriorated in terms of the photoelectric conversion efficiency even upon exposure to light irradiation over a long period of time.

The fiber-bearing foamed material member of the back side covering structure functions to prevent the photovoltaic element enclosed in the solar cell module from being damaged due to external pressure applied to the solar cell module. Particularly, the use of the fiber-bearing foamed material member enables obtainment of a desirable solar cell module which can be stably maintained without the photovoltaic element (or the solar cell) enclosed therein being damaged even when the solar cell module is placed on an irregular surface of a sandy plain, sandy beach or the like and when a person steps on the module so as to apply a high external pressure thereon. In the case where as the foamed material constituting the fiber-bearing foamed material member, a foamed material capable of being readily deformed is used, there can be attained a highly reliable light weight solar cell module while reducing the amount of a hard resin to be used. Even in the case where a foamed material with a high expansion ratio is used as the foamed material, there can be attained a highly reliable light weight solar cell module, which is free of defects such as recesses, cavities, or the like, with the use of a small amount of the resin constituting the foamed material.

In the case of a solar cell module having a support member (or a reinforcing support member), because of the use of the fiber-bearing foamed material member, a desirable adiathermic is provided so that the photoelectric conversion member of the photovoltaic element (or the solar cell) is effectively heat-annealed during the use, whereby the photovoltaic element is effectively prevented from being deteriorated due to light irradiation. And, as for this solar cell, when it is used as a roofing material of a building or it is placed on a support table outdoors, the fiber-bearing foamed material effectively functions as a heat insulation material.

Further, because of the use of the fiber-bearing foamed material, there can be attained a highly reliable solar cell module which does not cause problems such as layer separation, isolation defects, and the like in a temperature cycle test and a temperature and humidity cycle test.

As previously described, the present invention includes a process for the production of a solar cell module comprising a photovoltaic element (or a solar cell) having a photoactive semiconductor layer as a photoelectric conversion member which is enclosed by a front surface covering material disposed on the light receiving side of said photovoltaic element and a back side covering material having a foamed material disposed to cover the rear face side of said photovoltaic element, said process comprising a step of laminating said surface side covering material and said back side covering material to said photovoltaic element so as to enclose said photovoltaic element by said surface side covering material and said back side covering material by way of thermocompression treatment, characterized in that during said lamination step, an unfoamed material containing a foaming agent which is capable of use as a constituent of the back side covering material is foamed to form a foamed material layer in the back side covering material by decomposing said foaming agent.

The process according to the present invention enables effective production of a highly reliable solar cell module in a simple manner without conducting a separate step of laminating a foamed material.

In the process according to the present invention, as the foamed material layer is formed during the lamination step by way of thermocompression treatment, the resulting foamed material layer has a sufficient heat history and is in a state free of the occurrence of thermal contraction. In fact, the solar cell module produced by the process according to the present invention is free of the occurrence of problems such as layer separation, isolation defects, and the like in temperature cycle testing and temperature and humidity cycle testing.

Further, in the process according to the present invention, when a stacked body comprising an unfoamed material containing a foaming agent, and a fiber, or a material comprising a nonfoamed material containing a foaming agent and which is incorporated with a fiber therein is used as the foaming agent-containing unfoamed material, there can be attained the formation of a desirable fiber-bearing foamed material layer. The resultant fiber-bearing foamed material layer is free of the occurrence of recesses, cavities or the like.

In the process according to the present invention, when the above lamination step is conducted in a face-up manner wherein the light receiving face of the photovoltaic element faces upward, it is possible to surely form a skin layer at the foamed material layer. In this case, water invasion into the foamed material layer from the rear side is effectively prevented.

Further, in the process according to the present invention, when the above lamination step is conducted using a release member of $1.0 \times 10^4$ cm$^3$/(m$^2$.24h.atm) in nitrogen permeability, the expansion ratio of the foamed material layer formed is increased.

In the following, description will be made of embodiments of the present invention.

Figure 1B:
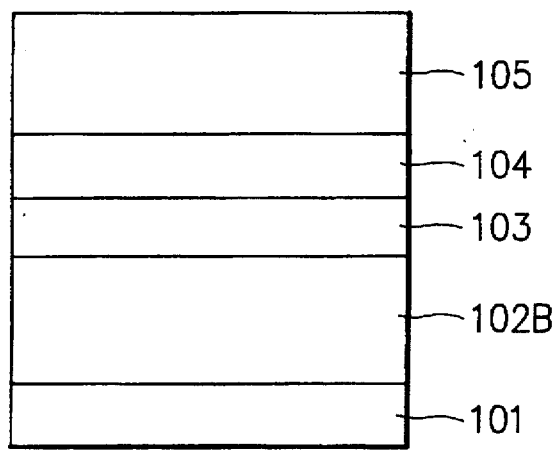

FIGS. 1(A) and 1(B) are schematic cross-sectional views illustrating the constitution of an example of a solar cell module according to the present invention.

Figure 2A:
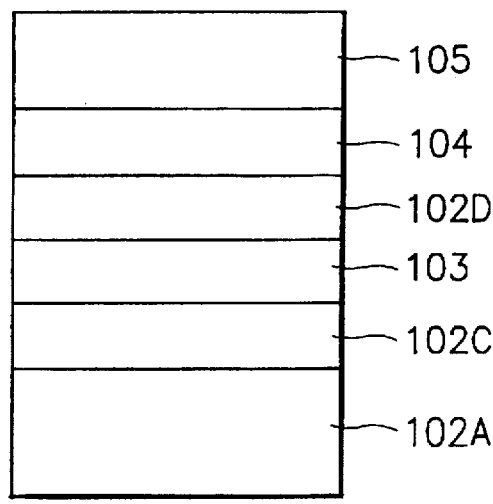
FIGS. 2(A) and 2(B) are schematic cross-sectional views illustrating another example of a solar cell module according to the present invention.
Figure 2B:
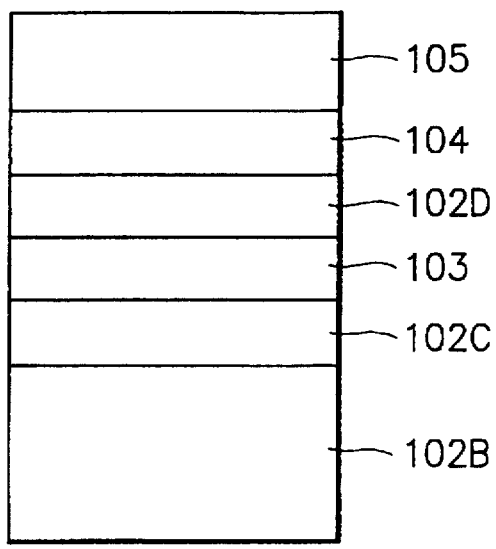

FIGS. 2(A) and 2(B) are schematic cross-sectional views illustrating the constitution of another example of a solar cell module according to the present invention.

In FIGS. 1(A) and 1(B) and FIGS. 2(A) and 2(B), reference numeral 101 indicates a support member, reference numeral 102A an unfoamed material layer, reference numeral 102B a foamed material layer (resulted from the nonfoamed material layer 102A), reference numeral 103 an insulating material layer, reference numeral 104 a photovoltaic element (or a solar cell), and reference numeral 105 a front surface covering material. In FIGS. 2(A) and 2(B), reference numeral 102C indicates a lower adhesive layer, and reference numeral 102D an upper adhesive layer.

The configuration shown in FIGS. 2(A) and 2(B) is a partial modification of that shown in FIGS. 1(A) and 1(B), wherein in the latter configuration, the support member 101 is omitted, and two adhesive layers, namely, the lower adhesive layer 102C and the upper adhesive layer 102D, are used.

A stacked body shown in FIG. 1(A) comprising the unfoamed material layer 102A, the insulating material layer 103, the photovoltaic element 104, and the front surface covering material 105 stacked in the named order on the support member 101 is subjected to thermocompression treatment wherein the unfoamed material layer 102A is converted into a foamed material layer 102B shown in FIG. 1(B), whereby the stacked body shown in FIG. 1(A) is converted into a solar cell module having the configuration shown in FIG. 1(B) which comprises a stacked body comprising the foamed material layer 102B, the insulating material layer 103, the photovoltaic element 104, and the front surface covering material 105 laminated in the named order on the support member 101. In the stacked body shown in FIG. 1(A), the unfoamed material layer 102A and the insulating material layer 103 constitutes a back side covering material. Similarly, in the stacked body shown in FIG. 1(B), the foamed material layer 102B and the insulating material layer 103 constitutes a back side covering material.

A stacked body shown in FIG. 2(A) comprising the unfoamed material layer 102A, the lower adhesive layer 102C, the insulating material layer 103, the upper adhesive layer 102D, the photovoltaic element 104, and the surface side covering material 105 stacked in the named order is subjected to thermocompression treatment wherein the unfoamed material layer 102A is converted into a foamed material layer 102B shown in FIG. 2(B), whereby the stacked body shown in FIG. 2(A) is converted into a solar cell module having the configuration shown in FIG. 2(B) which comprises a stacked body comprising the foamed material layer 102B, the lower adhesive layer 102C, the insulating material layer 103, the upper adhesive layer 102D, the photovoltaic element 104, and the front surface covering material 105 laminated in the named order, wherein the lower adhesive layer 102C serves to improve the adhesion between the foamed material layer 102B and the insulating material layer 103 and the upper adhesive layer 102D serves to improve the adhesion between the insulating material layer 103 and the photovoltaic element 104.

In the stacked body shown in FIG. 1(A), the unfoamed material layer 102A and the insulating material layer 103 constitute a back side covering material. Similarly, in the stacked body shown in FIG. 1(B), the foamed material layer 102B and the insulating material layer 103 constitute a back side covering material.

In the stacked body shown in FIG. 2(A), the unfoamed material layer 102A, the lower adhesive layer 102C, the insulating material layer 103, and the upper adhesive layer 102D constitute a back side covering material. Similarly, in the stacked body shown in FIG. 2(B), the foamed material layer 102B, the lower adhesive layer 102C, the insulating material layer 103, and the upper adhesive layer 102D constitute a back side covering material.

In not only the solar cell module shown in FIG. 1(B) but also the solar cell module shown in FIG. 2(B), light is impinged through the front surface covering material 105 side, and the impinged light passes through the surface side covering material 105 to reach the photovoltaic element 104 to generate an electromotive force, which is outputted through terminals not shown.

The support member 101 serves as a reinforcing member and therefore, it is not always necessary. The support member 101 may be optionally provided depending upon the application.

There are two kinds of solar cell modules in terms of rigidity, namely, a permanent type solar cell module which is used outdoors, and a portable type solar cell module excelling in flexibility. The permanent type solar cell module is integrated with a building member, mounting on a frame, or mounted on a support table though a frame. Therefore the permanent type solar cell module is required to have a sufficient rigidity. Particularly, it is generally advised that the permanent type solar cell module should have a rigidity such that it can endure a wind speed of 30 to 40 m/sec.

In the present invention, when the solar cell module has a fluororesin film as the front surface covering material 105 without disposing a glass plate thereon, it is effective for the solar cell to be provided with the support member 101 (the reinforcing member) in order to meet the above requirement.

In the present invention, the support member 101 can include steel members, glass fiber reinforced plastic members, hard plastic members, and timber members.

When the solar cell module is of the type that is integrated with a building member, it is desired to be configured such that an improvement in rigidity can be readily attained by subjecting it to bending processing so that it can be readily engaged in a channel of a member to which the solar module is intended to be installed. For this purpose, a steel member or stainless steel member is desired to be used as the support member. The solar cell having such steel member as the support member can be desirably used as a roof member of a building since the steel member is not only not melted when exposed to a flame but also it is hardly deformed. In this case, it is desired for the support member to excel in rustproofing and also in weatherability. In order for the steel member as the support member to have a desirable rustproofing and weatherability, it is possible to coat the steel member with an anticorrosion paint excelling in weatherability.

In the case where the adhesion between the foamed material layer and the support member is not sufficient, it is possible to dispose an adhesive layer or a binder layer between the foamed material layer and the support member upon the lamination of the support member to the foamed material layer. The adhesive layer may comprise a thermoplastic resin such as ethylene-vinyl acetate copolymer. The binder layer may comprise an emulsion paint.

As for the above described portable type solar cell module, it is suitable for use in a place where no electric cable system is available, or for use as a power supply source for batteries used in automobiles or yachts. For these use purposes, the solar cell module is required to be flexible and light. Particularly, it is desired to be light so that it can be easily carried and that when not used, it can be easily folded or reeled in order to store.

In the case where the portable type solar cell module is used as above described, the back side covering material thereof is often exposed to severe environmental conditions. For instance, it may be carried while dragging on the ground or it is accidentally stepped on. In order to prevent the photovoltaic element of the solar cell module from being damaged due to external pressure applied in such case, the foamed material layer is disposed in the back side covering material.

In the case where the foamed material layer is insufficient in abrasion resistance and shock resistance, it is possible for the foamed material layer to have a protective film on the rear face thereof. As such protective film, there can be mentioned films having weatherability, flexibility, water resistance, gasoline resistance, and plasticizer transfer resistance. Specific examples of films usable as the protective film are low density polyethylene, polyethylene copolymer, ethylene-vinyl acetate copolymer with vinyl acetate content of 30 wt. % or less, plasticizer-containing polyvinyl chloride, polyester, and vinyl fluoride.

In the case where the adhesion between the foamed material layer and the protective film layer is not sufficient, it is possible to dispose an adhesive layer or a binder layer between the foamed material layer and the support member upon the lamination of the protective film layer to the foamed material layer. The adhesive layer may comprise a thermoplastic resin such as ethylene-vinyl acetate copolymer, ethylene-ethylacrylate copolymer, polyvinyl butyral, silicone resin, acrylic resin, and epoxy resin. The binder layer may comprise an emulsion paint.

The use of the protective film layer provides an advantage in the production of a solar cell module, in addition to the advantage of protecting the solar cell module. That is, the use of the protective film layer prevents gas, which is generated when the foaming agent used upon the formation of the foamed material layer is decomposed, from leaking to the outside.

In the present invention, the foregoing adhesive layer (as the lower adhesive material layer 102C shown in FIG. 2(A)) may be disposed between the unfoamed material layer 102A and the insulating material layer 103 or it may be disposed between the insulating material layer 103 and the photovoltaic element 104 (as the upper adhesive layer 102D shown in FIG. 2(A)). By this, the resultant has an improved adhesion between the foamed material layer 102B and the insulating material layer 103 or between the insulating material layer 103 and the photovoltaic element 104.

As for the adhesive used as the above adhesive layer, it is desired to be in solution at the initial stage of conducting the thermocompressing treatment and to be in a crosslinked state after the completion of the thermocompression treatment. The crosslinking of the adhesive is desired to be conducted by using a crosslinking agent such as an organic peroxide. By crosslinking the adhesive using the crosslinking agent, the cohesive force of the resin constituting the adhesive is increased to prevent the adhesive resin from being broken within the layer. In this case, when the adhesive layer comprising the crosslinking agent-containing adhesive is present between the support member and the foamed material layer, there is provided a covalent bond not only at the interface with the foamed material layer but also at the interface with the support member, whereby the adhesion between the foamed material layer and the support member is improved.

Since the adhesive layer used in the back side covering material is situated on the rear side of the photovoltaic element (see, FIGS. 2(A) and 2(B)), it may be opaque. The foregoing resin used as the adhesive layer may contain a crosslinking agent, a thermal oxidation preventive agent, or the like for improving the heat resistance. In order to improve the light stability of the adhesive layer, the resin may contain an UV absorber, a light oxidation preventive agent, or the like.

In the case where the adhesion of the adhesive layer with the photovoltaic element (see, FIGS. 2(A) and 2(B)) is insufficient, the resin constituting the adhesive layer may contain a silane coupling agent, a titanate coupling agent, or the like in order to improve the adhesion. Further, in order to ensure electrical isolation of the photovoltaic element from the outside, it is desired to dispose an insulating resin layer in the adhesive layer. Such insulating resin layer may comprise a film composed of nylon, polyethylene, polyester, or polystyrene.

In the following, description will be made of the unfoamed material layer 102A.

The unfoamed material layer 102A comprises a resin containing a foaming agent. The foaming agent contained in the unfoamed material layer 102A is decomposed to produce gas during the thermocompression treatment of the stacked body shown in FIG. 1(A) or 2(A) to cause the formation of a foamed material layer as the foamed material layer 1023, whereby a stacked body of the configuration shown in FIG. 1(B) or 2(B) as a solar cell module is obtained.

The resin constituting the unfoamed material layer is required to have a desirable filling property. Particularly in this respect, it is desired to have a flowability of 1 dg/minute to 400 dg/minute in terms of melt flow rate in the flowability standard of ASTM4-1238. When a resin having a melt flow rate of less than 1 dg/minute is used as the resin constituting the unfoamed material layer, there cannot be attained a desirable flowability such that the irregularities present at the rear face of the photovoltaic element are filled in an acceptable state. By raising the temperature in the thermocompression treatment, there can be attained a desirable flowability. But in this case, there entails a drawback in that a filler (or a filler layer) used in the surface side covering material is yellowed to reduce the photoelectric conversion efficiency of the solar cell module. On the other hand, when a resin having a melt flow rate of beyond 400 dg/minute is used as the resin constituting the unfoamed material layer, the gas generated from the foaming agent is leaked to the outside without being trapped within the resin.

The cellular structure of the foamed layer which results from the gas generated by the foaming agent contained in the unfoamed material layer is required to have a sufficient heat resistance such that it is not broken by the high temperature employed in the thermocompression treatment. In view of this, the resin constituting the unfoamed material layer should be capable of being crosslinked.

In any case, the unfoamed material layer 102A is required to be capable of being converted into a foamed material layer 102B during the thermocompression treatment, and it is also required to have a sufficient adhesion with the insulating material layer 103 and also with the support member 101. In addition, the resin constituting the unfoamed material layer is required to have a certain quantity of a polar group in the molecule. As the resin constituting the unfoamed material layer, any resin may be used as long as the above requirements are fulfilled. Specific examples of such resin are natural rubber, styrene butadiene rubber (SBR), chloroprene rubber (CR), ethylene propylene rubber (EPR), ethyle-vinyl acetate copolymer, and ethylene-acrylic ester copolymers such as ethylene ethyl acrylate. In the case of separately using an adhesive, polyethylene, polypropylene, polystyrene, and ABS resin are also usable.

It is desired for the resin constituting the unfoamed material layer 102A to contain a crosslinking agent, a filler, or the like, in addition to the foaming agent.

The conversion of the unfoamed material layer 102A into a foamed material layer 102B may be conducted by (a) utilizing gas generated by way of chemical reaction, (b) incorporating a volatile solvent having a low boiling point into the resin and vaporizing the solvent, (c) incorporating a micro balloon filler into the resin, or (d) incorporating a soluble material into the resin and eluting the soluble material.

Of these methods, method (a) is the most appropriate. In the method (a), it is desired to use, as the foaming agent, an organic foaming agent capable of readily providing a closed wall cell foam. The organic foaming agent contained in the resin constituting the unfoamed material layer 102A is one that is decomposed to generate gas when subjected to heat treatment, wherein the resin is softened, expanded due to the gas generated therein, and cured to cause the formation of a foamed material layer 102B.

Besides the organic foaming agent, it is possible to use an inorganic foaming agent. Such inorganic foaming agents can include sodium bicarbonate, ammonium bicarbonate, ammonium carbonate, and azide compounds.

Other than these compounds, there can be also mentioned sodium borohydride and light metals which are capable of generating gas (specifically, hydrogen gas) when subjected to heat treatment. But the temperature at which they generate the gas (that is, hydrogen gas) is 400° C. or above and the generated hydrogen gas is dangerous. Therefore, these are not appropriate to be used.

In the case of using the above mentioned carbonate compounds as the inorganic foaming agent, continuous pores are readily formed in the resin constituting the unfoamed material layer. Therefore, due care should be given so that no water invades the resulting foamed material layer by conducting a waterproofing treatment, or the like.

In the following, further description will be made of the organic foaming agent. The organic foaming agent is desired to be one that can generate gas substantially comprising nitrogen at an appropriate gas generation rate by way of heat decomposition to cause the formation of fine and uniform closed wall cell foams in the resin constituting the unfoamed material layer. In the case where the organic foaming agent is of a heat decomposition temperature which is greatly different from the temperature employed in the thermocompression treatment of the stacked body having the non-foamed material layer, it is possible to use a foaming accelerating agent.

In any case, it is desired for the organic foaming to have a heat decomposition temperature such that the foregoing gas (substantially comprising nitrogen) is generated when the resin constituting the unfoamed material layer is softened and crosslinking reaction is proceeding in the resin, and the heat decomposition temperature is higher than the softening point of the resin and is of a degree of −40° C. to +40° C. of the one hour-half life temperature of a crosslinking agent comprising an organic peroxide which will be described later.

The formation of the foamed material layer from the unfoamed material layer should be conducted in such a manner that the crosslinking of the resin constituting the unfoamed material layer preferentially proceeds and gas from the foaming agent is generated.

The amount of the inorganic foaming agent or the organic foaming agent added should be in the range of 0.1 to 30 parts by weight versus 100 parts by weight of the resin constituting the unfoamed material.

As previously described, in the case of the portable type solar cell module, it is required for the unfoamed material layer (which is converted into the foamed material layer during the thermocompression treatment) to have not only a sufficient heat resistance during the thermocompression treatment but also a sufficient adhesion with the insulating material layer. In addition, when the foamed material layer (resulted from the unfoamed material layer) is situated on the rearmost side of the back side covering material of the solar cell module, it is required to have a sufficient abrasion resistance.

In order to meet these requirements, it is desired for the foamed material layer to be crosslinked. In order to make the foamed material layer in a crosslinked state, it is possible to employ free radical catalyzed crosslinking or ion crosslinking by way of chemical reaction with the use of a curing agent. Of these, the free radical catalyzed crosslinking is the most desirable in view of meeting the above requirements.

The free radical catalyzed crosslinking can include electron beam crosslinking, X-ray crosslinking, and chemical crosslinking. Of these, the chemical crosslinking is the most appropriate in view of an equipment used therefor. In general, the chemical crosslinking is conducted using an organic peroxide as a crosslinking agent.

The crosslinking of the resin constituting the unfoamed material layer by the chemical crosslinking using the organic peroxide as the crosslinking agent is performed by way of extracting hydrogen atoms in the resin by virtue of free radicals generated from the organic peroxide to form C—C bonds. In order to make the organic peroxide generate such free radicals upon crosslinking the resin, the organic peroxide should be activated by means of a thermal decomposition process, redox decomposition process, or ion decomposition process. Of these processes, the thermal decomposition process is the most appropriate.

As for the amount of the organic peroxide as the crosslinking agent to be added to the resin, it is preferably in the range of 0.1 to 5 wt. % versus the amount of the resin.

The organic peroxide usable as a crosslinking-agent is generally defined by its one hour-half life temperature.

As for the organic peroxide usable as the crosslinking agent in the present invention, there is no particular limitation in terms of the one hour-half life temperature. However, in the case where the resin constituting the unfoamed material layer is a resin principally comprising an olefin resin, as the temperature employed in the thermocompression treatment is about 90° to 150° C., it is desired to use those organic peroxides having a one hour-half life temperature of 100° to 170° C. as the crosslinking agent. There is no specific limitation for the relationship between the decomposition temperature of the foaming agent and that of the crosslinking agent. However, it is desired that the one hour-half life temperature of the organic peroxide as the crosslinking agent is higher than the decomposition temperature of the foaming agent.

It is possible for the unfoamed material layer to contain a filler capable of serving not only as a nucleus material for adjusting the number of pores formed therein but also as an extender. By using such filler in a relatively large amount, the number of pores formed is increased to result in forming a dense foamed material layer from the unfoamed material layer. As for the amount of the filler, the addition thereof in an amount of about 1 wt. % versus the amount of the resin constituting the unfoamed material layer is sufficient. The addition of the filler in an amount which is greater than said amount is not effective in increasing the number of pores formed. Separately, as the extender, it is possible to add an appropriate extender.

Specific examples of such filler are calcium carbonate, clay, talc, magnesium oxide, zinc oxide, carbon black, silicon dioxide, titanium oxide, plastic in fine particle form, orthoboric acid, alkali metal salts of aliphatic acids, citric acid, and sodium bicarbonate.

As for the filling property of the back side covering material which is a feature of the present invention, it determined depending on the formulation of the unfoamed material layer and the conditions in the covering process by way of thermocompression treatment. Particularly in this respect, the unfoamed material layer is heated to a temperature at which the resin constituting the unfoamed material layer exhibits flowability, wherein the resin is fused to fill the irregularities present at the rear face of the photovoltaic element, then the foaming agent contained in the resin constituting the unfoamed material layer is decomposed to generate gas to form minute pores in the resin, thereby causing the formation of a foamed material layer. In this case, when the generation of the gas from the foaming agent is terminated and the resultant foamed material layer is still maintained in a heated state, there is a tendency that the structure of the foamed material layer is broken. In order to prevent the occurrence of this problem, it is desired to make sure that the resin is crosslinked during the above process of forming the foamed material layer.

The term "irregularities" present at the rear face of the photovoltaic element in the present invention is meant to include irregularities of the back side covering material.

Now, in the case of a solar cell module having a back side covering material comprising an insulating material layer, the irregularities present at the rear face of the photovoltaic element cannot be filled to be in a smooth state only by the insulating material layer, i.e. the solar cell module is unavoidably accompanied by irregularities caused at the residual insulating material layer.

The foamed material layer in the present invention is desired to be of a closed cell wall foam structure which hardly absorbs water, in order to prevent the foamed material layer from having an increased thermal conductivity due to water invasion thereinto.

In the case of the foregoing permanent type solar cell module, as previously described, the foamed material layer of the back side covering material serves to protect the rear face of the photovoltaic element thereof. Further, the use of the foamed material layer as the back side covering material makes the resulting solar cell module such that it can float on water. The foamed material layer in this case also should be of a closed cell wall foam structure which hardly absorbs water.

As for the thickness of the foamed material layer, it is different depending on the use environment. In the case where the solar cell module is used as a roofing member of a building or it is used by placing it on a support table, the thickness of the foamed material layer is desired to be in the range of 0.5 to 15 mm. In the case where the thickness of the foamed material layer is less than 0.5 mm, there cannot be attained a desirable temperature increasing effect for the photovoltaic element, wherein the photovoltaic element is not sufficiently heat-annealed during use and therefore, there cannot be expected a desirable recovery of the deterioration in the photoelectric conversion efficiency of the photovoltaic element due to the Staebler-Wronski effect. On the other hand, in the case where the thickness of the foamed material layer greater than 15 mm, the foamed material layer is liable to suffer from significant thermal expansion or significant thermal contraction to cause layer separation at the interface with the adjacent member in a temperature cycle test, temperature and humidity cycle test, and the like.

In the case of the foregoing portable type solar cell module, as previously described, it is required for the foamed material layer to have a sufficient ability to prevent the photovoltaic element from being damaged due to external pressure applied thereto.

By the way, in the case of a portable solar cell module, there can occur damage from external pressure applied thereto, for instance, when the solar cell module is stepped on or when it is dragged on the ground. Particularly in the former case, when the solar cell module is present on an irregular surface of soil or sand and it is stepped on, the solar cell module suffers from deformation of the photovoltaic element contained therein, which is caused from the rear side of the solar cell module. In order to relax such stress, the solar cell module should have a back side covering material comprising a material having an excellent buffering property but not a highly rigid material.

The foamed material layer as the back side covering material in the present invention effectively prevents the occurrence of the above problems while satisfying the above described situation.

The foamed material layer in the portable type solar cell module in the present invention should have a thickness which is greater than the size of a grain of sand or that of a lump of soil. However, in the case where the foamed material layer is excessively thick, problems such as curling and the like are liable to occur. Therefore, in general, the thickness of the foamed material layer in the case of the portable type solar cell module in the present invention should be in the range of 1 to 15 mm.

In the case of the portable type solar cell module in the present invention, as well as in the case of the permanent type solar cell module, it may have the foregoing support member or/and the foregoing protective film on the foamed material layer.

As previously described, the resin constituting the unfoamed material layer is fluidized by the gas generated from the foaming agent during the thermocompression treatment. During the thermocompression treatment, as the unfoamed material layer will have irregularities corresponding to the irregularities present at the rear face of the photovoltaic element, the recessed portions of the unfoamed material layer are less pressed and because of this, the gas generated from the foaming agent is liable to converge at such less pressed portion. In this case, it is considered that the gas thus converged would make the resin present nearby to crosswise fluidize thereby causing a recess or cavity in the resulting foamed material layer. In order to prevent the occurrence of such recession or cavity, it is necessary to make sure that during the thermocompression treatment, the resin constituting the unfoamed material layer is heat-fused to fill the irregularities present at the rear face of the photovoltaic element and that when the foaming agent is decomposed to generate the gas for converting the unfoamed material layer into a foamed material layer, the resin is partly prevented from being fluidized. For this purpose, it is desired to incorporate an appropriate fiber into the unfoamed material layer which is to be converted into the foamed material layer. The fiber contained in the unfoamed material layer is partly or entirely immersed in the resin constituting the unfoamed material layer when the foaming agent generates the gas at the stage after the resin of the unfoamed material layer has been heat-fused to fill the irregularities present at the rear face of the photovoltaic element in the thermocompression treatment, whereby the resin of the unfoamed material layer is prevented from being crosswise fluidized as above described. By this, even if the unfoamed material layer has a less pressurized portion, the gas generated from the foaming agent is not converged at such less pressed portion to prevent the resin of the unfoamed material layer from being crosswise fluidized. Hence, there can be attained the formation of a desirable foamed material layer free of a recess or cavity which is liable to occur when the expansion ratio is high.

Description will now be made of the fiber used in the present invention. As the fiber, any fibers may be optionally used without regard to their configuration as long as they are satisfactory in terms of heat resistance, weatherability, and adhesion.

As apparent from the above description, the fiber used in the present invention must prevent the resin constituting the unfoamed material layer from being fluidized as above described. For this purpose, the fiber is required to have a sufficient heat resistance such that it is not melted during the thermocompression treatment. In the thermocompression treatment, the material covering the photovoltaic element (specifically, the back side covering material in this case) is exposed to a temperature of 120° to 180° C. in general. And the period of time during which the thermocompression treatment is conducted is 2 hours or less, including the period of time required to raise the temperature to a maximum temperature. For instance, when the maximum temperature is 180° C., the period of time for maintaining at this maximum temperature is 10 minutes or less. The fiber is satisfactory as long as it has a heat resistance which can endure this temperature condition.

There are commercially available fibers composed of inorganic compounds (these fibers will be hereinafter referred to as inorganic fibers) and fibers composed of organic compounds (these fibers will be hereinafter referred to as organic fibers). These inorganic fibers are mostly heat resistant.

As for these organic fibers, they can be expressed by the relationship based on the following equation.

$$T_m = \Delta H_m / \Delta S_m$$

with Tm being a melting point, $\Delta H_m$ being a melting enthalpy, and $\Delta S_m$ being a melting entropy.

The heat resistance of the organic fiber may be increased by enlarging the $\Delta H_m$ and diminishing the $\Delta S_m$.

Increase of the $\Delta H_m$ may be accomplished by increasing the intermolecular force. The intermolecular force may be increased by increasing the dipole-dipole interaction or the number of hydrogen bonds. Increase of the dipole-dipole interaction may be accomplished by introducing an amide group, imide group, nitrile group, or halogenated hydrocarbon group having a strong polarity into the molecule. Increase of the number of hydrogen bonds may be accomplished by introducing an ether group, amide group, or urethane group into the molecule. Reduction of the $\Delta S_m$ may be accomplished by increasing the symmetry properties of the molecule or making the molecule have a stiff portion comprising, for example, an aromatic ring.

Even in the case where the organic fiber has a molecular structure which is low in heat resistance, the organic fiber may be made to have an improved heat resistance by crosslinking it. Further, by causing intermolecular bonding by way of covalent bonding in the molecule, the molecular motion is controlled and as a result, there is provided an improvement in the heat resistance.

In the present invention, the organic fiber is occasionally contained in the foamed material layer is exposed at the surface of the foamed material layer. The fiber in this case must excel in weatherability, water resistance, and gasoline resistance. Particularly, in the case of the portable type solar cell module, the organic fiber must excel in these properties because the solar cell module will be used under various environmental conditions. Further, in the case of the portable type solar cell module, since it will be used in various places or on a curved face, the organic fiber must also excel in flexibility. Further in addition, the organic fiber desirably exhibits excellent adhesion with the foamed material layer.

As such organic fiber excelling in adhesion with the foamed material layer, there can be mentioned those organic resin fibers having a polar group such as an ester group, carbonyl group, or hydroxyl group.

In the case where the fiber is inferior in adhesion with the foamed material layer, it may be made to have an improved adhesion by coating it with an adhesion enhancing agent such as a silane coupling agent or by treating it so as to have a polarity at the surface thereof, for instance, by way of corona discharging treatment.

Specific examples of the fiber usable in the present invention are glass fiber, polyester fiber, polypropylene fiber, rayon fiber, nylon fiber, and fluororesin fiber.

The fiber used in the present invention desirably has a sufficient fiber length in order to prevent the resin of the unfoamed material layer from being undesirably fluidized as above described.

In the case of using a monofilament as the fiber, it is desired to be previously incorporated into the resin constituting the nonfoamed material layer. In this case, it is not necessary to lay the monofilament as the fiber under the unfoamed material layer. However, in any case, the fiber length of the monofilament is an important factor. Particularly, the fiber length of the monofilament is desired to be in the range of 10 to 50 mm. When the monofilament is of a fiber length of less than 10 mm, the monofilament fluidizes together with the resin of the unfoamed material layer and because of this, it is difficult to prevent the fluidization of the resin as desired. On the other hand, when the monofilament is of a fiber length of beyond 50 mm, it is broken into a plurality of pieces having a short fiber length upon the previous incorporation into the resin of the unfoamed material layer, whereby the undesirable fluidization of the resin as above described is not effectively prevented.

In addition, when a monofilament having a long fiber length is contained in a resin for the formation of the unfoamed material layer, the resin containing the monofilament therein results in an increased viscosity upon the formation of the nonfoamed material layer and because of this, it is necessary for the formation of the unfoamed material layer to be conducted at a high temperature. In this case, there entails a problem in that the foaming agent and crosslinking agent contained in the resin for the formation of the unfoamed material layer are decomposed.

In the present invention, it is important to make sure that the resin constituting the unfoamed material layer is readily impregnated into the fiber. For this purpose, the fiber is desired to have a diameter of 1 to 250 µm. When a fiber having a diameter exceeding 250 µm is contained in the resin constituting the unfoamed material layer, there entail problems in that the fiber prevents the resin from desirably moving when foaming occurs in the unfoamed material layer by virtue of the gas generated from the foaming agent, whereby there cannot be attained a high expansion ratio for the unfoamed material layer. On the other hand, when a fiber having a diameter of less than 1 µm is contained in the resin constituting the unfoamed material layer, there entail problems in that the fiber is broken by the movement of the fiber when foaming is caused in the unfoamed material layer by virtue of the gas generated from the foaming agent, whereby the undesirable fluidization of the resin as above described is not effectively prevented.

The fiber diameter is more preferably in the range of 3 to 50 µm. In the case where the fiber is of a diameter of less than 3 µm, the fiber is likely difficult to efficiently handle, particularly in the layer lamination process. In the case where the fiber is of a greater diameter than 5 µm, the expansion ratio of the unfoamed material layer is slightly reduced.

The fibers usable in the present invention can include fiber members of various configurations. Specific examples are monofilaments, woven fabrics, and nonwoven fabrics.

In the case of using a monofilament as the fiber, it is desirably incorporated into the resin constituting the unfoamed layer as above described. As for the amount of the monofilament to be added, it is preferably in the range of 0.5 to 20 parts by weight versus 100 parts by weight of the resin of the unfoamed material layer. When the amount of the monofilament to be added is less than 0.5 part by weight, the undesirable fluidization of the resin of the unfoamed material layer as above described is not effectively prevented. On the other hand, when the amount of the monofilament to be added is beyond 20 parts by weight, there entail problems in that the resin containing the monofilament in such large amount for the formation of the unfoamed material layer reaches an excessively increased viscosity upon the formation of the unfoamed material layer, whereby there entail problems in that the foaming agent and crosslinking agent contained in the resin for the formation of the unfoamed material layer are decomposed; and the fluidization of the resin of the unfoamed material layer in the process of forming a foamed material layer from the unfoamed material layer is excessively prevented, whereby the formation of a foamed material layer with a high expansion ratio cannot be attained.

The formation of the unfoamed material layer may be conducted, for example, in the following manner. That is, when a polyethylene series resin is used as the resin for the formation of the unfoamed material layer, a composition comprising said resin, a given foaming agent and a given crosslinking agent is first provided, and a given monofilament is admixed into said composition, followed by subjecting to kneading at a temperature of 80° to 120° C., thereby obtaining a sheet usable as the unfoamed material layer.

In any case, since the foaming agent used in the present invention is decomposed at a temperature of 120° to 170° C., the formation of the unfoamed material layer must be conducted at a temperature which is lower than the decomposition temperature of the foaming agent.

In a preferred embodiment, as the fiber, either a woven fabric or a nonwoven fabric is used. These fabrics are configured such that respective constituent fibers are fixed with each other or are controlled such that they are immobilized. In the thermocompression treatment, the constituent resin of the foamed material layer is impregnated into such woven or nonwoven fabric, for instance, by laminating the latter to the former. In this case, since the woven or nonwoven fabric has an immobilized configuration as above described, the resin impregnated therein is in an immobilized state and because of this, no cavities is occur upon subjecting unfoamed material layer to foaming.

Description will now be made of the woven fabric and the nonwoven fabric.

The woven fabric is produced by way of plain weaving including thirl plain weave, twill weave, Turkey weave, mock leno weave, or leno weave.

In the present invention, woven fabrics which are produced by way of thirl plain weaving are desirably used in order to attain impregnation of the constituent resin of the unfoamed material layer into the fiber.

The woven fabric has a configuration such that fibers are knitted so that their movements are minimized. Because of this, the woven fabric is effective in immobilizing the constituent resin of the nonfoamed material layer. In the case of using a woven fabric having a rough weave texture, it is desired to conduct filling treatment by using an appropriate filler so that the weave texture is not broken.

As the filler used in the filling treatment, it is desired to use a filler which excels in adhesion with the constituent resin of the unfoamed material layer and is not fused at the temperature employed in the thermocompression treatment.

As for the woven fabric, a binder is usually employed for binding filaments. Such binder is desired to be removed by way of heat treatment. By removing the binder in this way, the binding of the filaments is loosened so that the constituent resin of the unfoamed material layer is readily impregnated into the woven fabric.

The unfoamed fabric is produced by randomly or uniformly dispersing fibers and molding the fibers thus dispersed into a plain-like state using a binder. The binder used in this case is desired to have a heat resistance which is similar to that of the fibers. In addition, the binder is desired to excel in adhesion with the constituent resin of the unfoamed material layer.

As for the length of the fiber used in the unwoven fabric, when the mobility of the fiber is prevented by the binder, it is possible to use a fiber having a short length.

The unwoven fabric usable in the present invention can include organic fiber unwoven fabrics produced by way of leno weaving without using a binder or by way of fiber welding without using a binder. In the case of using such organic fiber nonwoven fabric, due care should be given so that the constituent fibers are not separated one from the other during the thermocompression treatment.

In the nonwoven fabric, the constituent fibers are not knitted with each other but contact each other by means of the binder so as to immobilize them. This makes the resin impregnated in the nonwoven fabric such that it is difficult to mobilize.

As for the thickness of either the woven fabric or the nonwoven fabric used in the present invention, it is preferably in the range of 10 to 500 μm. When the thickness is beyond 500 μm, there entail problems in that the constituent resin of the unfoamed material layer is not sufficiently impregnated in the woven or nonwoven fabric and because of this, there cannot be attained a sufficient adhesion with the resulting foamed material layer, whereby the foamed material layer is often separated from the woven or nonwoven fabric. On the other hand, when the thickness is less than 10 μm, there entail problems in that there cannot be attained a sufficient thickness for preventing the constituent resin of the unfoamed material layer from being undesirably fluidized, whereby there is a tendency for recesses to be formed at the surface of the resulting foamed material layer and/or cavities occur within the foamed material layer.

The thickness of either the woven fabric or the nonwoven fabric is more preferably in the range of 50 to 200 μm. In the case where the thickness is less than 50 μm, there is a tendency that either the woven fabric or the nonwoven fabric is not readily handled upon the lamination thereof. In the case where the thickness is beyond 200 μm, the expansion ratio of the unfoamed material layer is slightly reduced.

As for each of the woven fabric and the nonwoven fabric used in the present invention, it is desired to be of an appropriate rough texture in terms of the amount of hole area. Particularly, either the woven fabric or the nonwoven fabric is desired to have a percent of hole area in the range of 20 to 90%. In the case where the amount of hole area is less than 20%, there entail problems in that the constituent resin of the unfoamed material layer is not impregnated into the fabric, whereby the effect of preventing the constituent resin of the nonfoamed unfoamed layer from being undesirably fluidized is small. In the case where the amount of hole area is beyond 90%, the constituent resin of the unfoamed material layer cannot be sufficiently prevented from being undesirably fluidized.

In the present invention, each of the woven fabric and the nonwoven fabric is desired to satisfy all the above described factors, i.e., the foregoing diameter, length, thickness, and amount of hole area. As a characteristic including these factors, a weighing capacity can be used. Particularly, each of the woven fabric and the nonwoven fabric is desired to have a weighing capacity in the range of 5 g/m$^2$ to 100 g/m$^2$. In the case where the weighing capacity is less than 5 g/m$^2$, the constituent resin of the unfoamed material layer cannot be sufficiently prevented from being undesirably fluidized. In the case where the weighing capacity is beyond 100 g/m$^2$, the amount of the constituent resin of the unfoamed material layer remaining without being fluidized is increased to cause a reduction in the expansion ratio of the unfoamed material layer. In a more preferred embodiment, the weighing capacity is in the range of 10 g/m$^2$ to 50 g/m$^2$. In this case, the amount of the constituent resin of the unfoamed material layer remaining without being fluidized is appropriate and a sufficient expansion ratio can be attained for the unfoamed material layer.

In the present invention, in order to foam the unfoamed material layer at a high expansion ratio, it is necessary to prevent the gas, which is generated by decomposing the foaming agent contained in the unfoamed material layer, from leaking to the outside. In order to attain this purpose, the foregoing lower adhesive layer 102C (see, FIGS. 2(A) and 2(B)) disposed between the unfoamed material layer and the insulating material layer also functions as a seal so that the gas does not leak to the outside while functioning to ensure the adhesion between the two layers.

In order to foam the unfoamed material layer at a high expansion ratio, the heat treatment of the unfoamed material layer is desired to be conducted at a high temperature within a short period of time. In order to seal the gas generated in the heat treatment of the unfoamed material layer at a high temperature, the member engaged in sealing the gas must have a sufficient heat resistance. Sealing of the gas is desirably conducted by way of edge sealing. The edge sealing may be conducted by using a release member as a lamination instrument, an adhesive as the above adhesive layer, and an insulating member as the above insulating material layer. Particularly, when the adhesive layer situated under the insulating material layer (see FIGS. 2(A) and 2(B)) is heated, it is fused to contact the release member thereby preventing the gas from leaking to the outside.

When the adhesive layer has a low viscosity at a high temperature, the gas is liable to pass through the adhesive layer. Hence, the adhesive layer is required to have a sufficient heat resistance. For this purpose, the adhesive layer is desired to be crosslinked. The crosslinked adhesive layer has an improved cohesive force with respect to the constituent resin thereof and is free from occurrence of breakage in the layer.

As previously described, the adhesive layer functions to cause covalent bonding not only at the interface with the foamed material layer but also at the interface with the insulating material layer, whereby the adhesion between the insulating material layer and the foamed material layer is ensured.

The insulating material layer 103 (see FIGS. 1(A) and 1(B) and FIGS. 2(A) and 2(B)) has a function of ensuring the adhesion between the photovoltaic element and the foamed material layer and another function of electrically isolating the photovoltaic element from the outside. The insulating material layer is required to excel in electrical insulation, physical strength, moisture resistance, and heat resistance. In the case where the insulating material layer is insufficient in adhesion with the photovoltaic element or the formed material layer, it is possible to dispose an adhesive layer (corresponding to the upper adhesive layer 102D (see FIG. 2(B)) between the insulating material layer and the photovoltaic element or an adhesive layer (corresponding to the lower adhesive layer 102C (see FIGS. 2(B)) between the insulating material layer and the foamed material layer. In this case, in view of work efficiency, it is desired to use a laminate comprising the lower adhesive layer, the insulating material layer, and the upper adhesive layer laminated in the named order. Each of these adhesive layers is desired to compose a resin which can be fused at a high temperature and can be crosslinked at a high temperature. However, in the case of a solar cell module which is used under environmental conditions where the temperature of the module is raised to about 80° C., the crosslinking of the resin is not always necessary. The insulating material layer may comprise a biaxially-oriented polyethylene terephthalate film, a nylon film, a glass fiber member, or a nonwoven fabric member made of a plastic fiber.

The photovoltaic element 104 may comprise a photovoltaic element used in single crystal silicon solar cells, polycrystalline silicon solar cells, amorphous silicon solar cells, copper-indium-selenide solar cells, or compound semiconductor solar cells.

Herein, as an example of such photovoltaic element, description will be made of a photovoltaic element having a structure comprising a semiconductor photoactive layer as a photoelectric conversion member and a transparent and conductive layer disposed in the named order on an electrically conductive substrate.

Figure 3:
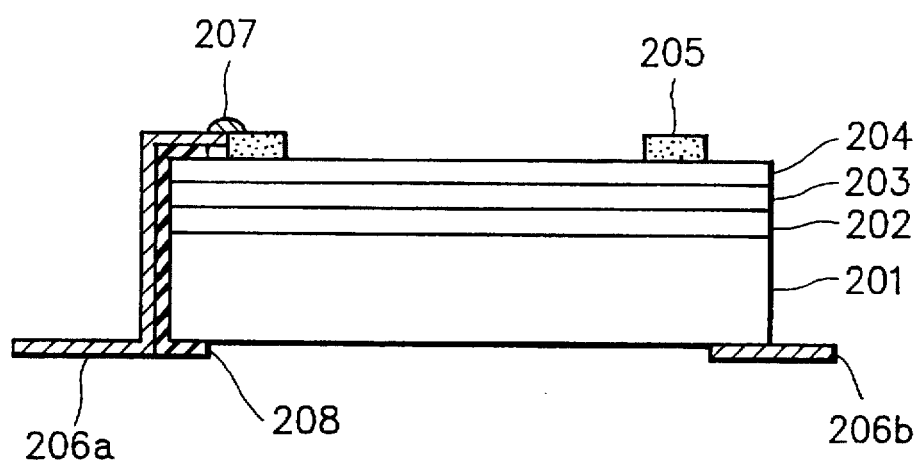
FIG. 3 is a schematic cross-sectional view illustrating an example of a photovoltaic element (or a solar cell) used in the present invention.

FIG. 3 is a schematic cross-sectional view illustrating the constitution of such photovoltaic element.

In FIG. 3, reference numeral 201 indicates an electrically conductive substrate, reference numeral 202 a back reflecting layer, reference numeral 203 a semiconductor active layer, reference numeral 204 a transparent and conductive layer, reference numeral 205 a collecting electrode (or a grid electrode), reference numeral 206a a positive side power output terminal, reference numeral 206b a negative side power output terminal, reference numeral 207 an electrical connection means, and reference numeral 208 an insulator.

The photovoltaic element shown in FIG. 3 comprises the back reflecting layer 202, the semiconductor photoactive layer 203, the transparent and conductive layer 204, and the collecting electrode 205 disposed in the named order on the electrically conductive substrate 201, wherein the positive output terminal 206a is electrically connected to the collecting electrode 205 by means of the electrical connection means 207 and it extends from the collecting electrode 205 while being insulated from the side edge of the element by means of an insulator 208, and the negative side output terminal 206b is electrically connected to the electrically conductive substrate 201 by means of an electrical connection means (not shown). In this configuration, the positive side power output terminal 206a and the negative side power output terminal 206b may be changed into a negative side power output terminal and a positive side power output terminal depending upon the structure of the semiconductor photoactive layer.

The electrically conductive substrate 201 serves not only as a substrate for the photovoltaic element but also as a lower electrode. As for the electrically conductive substrate 201, there is no particular restriction as long as it has an electrically conductive surface. Specifically, it may be an electrically conductive member composed of a metal such as Si, Ta, Mo, W, Al, Cu, Ti, or Fe, or an electrically conductive member composed of an alloy of these metals such as stainless steel, or the like. Besides these, the electrically conductive substrate 201 may comprise a carbon sheet or a Pb-plated steel sheet. Alternatively, the electrically conductive substrate 201 may be a film or sheet made of a synthetic resin or a sheet made of a ceramic. In this case, the substrate is coated with an electrically conductive film on the surface thereof.

The back reflecting layer 202 disposed on the electrically conductive substrate 201 may comprise a metal layer, a metal oxide layer, or a two-layered structure comprising a metal layer and a metal oxide layer. The metal layer may be composed of a metal such as Ti, Cr, Mo, W, Al, Ag, or Ni, or an alloy of these metals. The metal oxide layer may comprise a metal oxide such as ZnO, TiC$_2$, SnO$_2$, or the like.

The back reflecting layer 202 is desired to have a roughened surface in order to effectively utilize incident light.

The back reflecting layer 202 may be formed by a conventional film-forming technique such as resistance heating evaporation, electron beam evaporation, or sputtering.

The semiconductor photoactive layer 203 functions to perform photoelectric conversion. The semiconductor photoactive layer may be composed of a non-single crystal silicon semiconductor material such as an amorphous silicon semiconductor material or polycrystalline silicon semiconductor material, or a compound semiconductor material. In any case, the semiconductor photoactive layer comprised of any of these semiconductor materials may be of a stacked structure with a pin junction, a pn junction or a shottky-type junction. Specific examples of the compound semiconductor material and junctions are CuInSe$_2$, CuInS$_2$, GaAs, CdS/Cu$_2$S, CdS/CdTe, CdS/InP, CdTe/Cu$_2$Te, and the like.

The semiconductor photoactive layer 203 comprised of any of the above-mentioned semiconductor materials may be formed by a conventional film-forming technique. For instance, the non-single crystal silicon semiconductor photoactive layer may be formed by a conventional chemical vapor phase growing technique such as plasma CVD or photo-induced CVD using a film-forming raw material gas capable of imparting silicon atoms, such as silane gas, or a conventional physical vapor phase deposition technique such as sputtering using a Si-target. The semiconductor photoactive layer composed of a polycrystalline silicon semiconductor material may be formed by a conventional polycrystalline silicon film-forming method of providing a fused silicon material and subjecting the fused silicon material to film-making processing or another conventional polycrystalline silicon film-forming method of subjecting an amorphous silicon material to heat treatment.

The semiconductor photoactive layer 203 composed of any of the above-mentioned compound semiconductor materials may be formed by conventional ion plating, ion beam deposition, vacuum evaporation, sputtering, or electrolytic technique in which a precipitate is formed by way of electrolysis of a desired electrolyte.

The transparent and conductive layer 204 functions as an upper electrode. The transparent and conductive layer may comprise $In_2O_3$, $SnO_2$, $In_2O_3$—$SnO_2$ (ITO), ZnO, $TiO_2$, or $Cd_2SnO_4$. Besides these, it may comprise a crystalline semiconductor layer doped with an appropriate impurity at a high concentration.

The transparent and conductive layer 204 formed of the above-mentioned materials may be formed by a conventional resistant heating evaporation, electron beam evaporation, sputtering, spraying, or CVD.

The above-described impurity-doped crystalline semiconductor layer as the transparent and conductive layer 204 may be formed by a conventional impurity-diffusion film-forming method.

For the purpose of effectively collecting electric current generated by virtue of photoelectromotive force, a collecting electrode (or the grid electrode) 205 may be disposed on the transparent and conductive layer 204. The collecting electrode 205 may be in the form of a stripe shape or comb shape.

The collecting electrode 205 may comprise a metal such as Ti, Cr, Mo, W, Al, Ag, Ni, Cu, or Sn, or an alloy of these metals. Alternatively, the collecting electrode 205 may be formed of an electrically conductive paste or an electrically conductive resin. The electrically conductive paste can include electrically conductive pastes comprising powdered Ag, Au, Cu, Ni, or carbon dispersed in an appropriate binder resin. The binder resin can include polyester, epoxy resin, acrylic resin, alkyd resin, polyvinyl acetate, rubber, urethane resin, and phenol resin.

The collecting electrode 205 may be formed by means of sputtering using a mask pattern, resistance heating evaporation, or CVD. It may also be formed by depositing a metal film over the entire surface and subjecting the metal film to etching treatment to form a desired pattern, by directly forming a grid electrode pattern by means of photo-induced CVD, or by forming a negative pattern corresponding to a grid electrode pattern and subjecting the resultant to plating treatment.

The formation of the collecting electrode 205 using any of the above-described electrically conductive pastes may be conducted by subjecting the electrically conductive paste to screen printing or by fixing a metal wire to the screen-printed electrically conductive paste, if necessary, using a solder. The output terminals 206a and 206b serve to output the electromotive force. The output terminal 206a is electrically connected to the collecting electrode 205 by means of the electrical connection means 207. The electrical connection means 207 may comprise an electrically conductive layer formed by using a metal body and an electrically conductive paste or a solder. The output terminal 206b is electrically connected to the electrically conductive substrate by means of the electrical connection means (not shown). The electrical connection means may comprise an electrical connection region formed by spot welding or soldering an appropriate metal body such as a copper tab.

In general, there are provided a plurality of photovoltaic elements having the above constitution, and they are integrated in series connection or in parallel connection depending upon the desired voltage or current. It is possible to dispose the integrated elements on an insulating member such that the desired voltage or electric current can be obtained.

Description will now be made of the surface side covering material 105 (see FIGS. 1(A) and 1(B), and FIGS. 2(A) and 2(B)) used in the present invention.

The surface side covering material 105 has the functions of covering the irregularities at the light receiving face of the photovoltaic element while preventing the photovoltaic element from being influenced by external factors such as temperature changes and/or humidity changes in the external environment, externally applied impacts, or the like, and allowing a sufficient quantity of light to pass therethrough to reach the photovoltaic element so that the photovoltaic element can perform photoelectric conversion. Hence, the surface side covering material is required to excel in transparency, weatherability, adhesion, packing property, heat resistance, and impact resistance. In order for the surface side covering material to meet these requirements, the surface side covering material is desired to comprise a laminate comprising a filler layer (or an adhesive layer) and a surface protective film.

Description will now be made of the filler layer.

The filler layer is required to comprise a resin excelling especially in transparency, weatherability, and adhesion. The filler layer is also required to exhibit flowability for filling irregularities in the photovoltaic element during the process of producing the solar cell module. In the case where the production of the solar cell module is conducted by way of thermocompression treatment, the filler layer comprises a thermoplastic resin such as a polyolefine resin, butyral resin, urethane resin, silicone resin, or fluororesin. Specific examples are EVA (ethylene-vinyl acetate copolymer), EMA (ethylene-methyl acrylate copolymer), EEA (ethylene-ethyl acrylate copolymer), and polyvinyl butyral resin.

In the case where the filler layer is insufficient in adhesion, it is possible for the filler layer to have an improved adhesion by incorporating a silane coupling agent or a titanate coupling agent into the resin constituting the filler layer. The filler layer essentially comprised of the above described resin excels in weatherability. However, in order to attain a further improved weatherability for the filler layer, the filler layer is desired to contain an appropriate UV absorber such as organic or inorganic UV absorber. The organic UV absorber can include organic compounds such as salicylic acid series compounds, benzophenone series compounds, benzotriazole series compounds, and acrylonitrile series compounds. Specific examples are 2-hydroxy-4-methoxybenzophenone, 2-hydroxy-4-n-octoxybenzophenone, and 2-(2-hydroxy-5-t-octylphenyl)-benzotriazole.

Specific examples of inorganic UV absorber are $TiO_2$, $CeO_2$, $ZnO$, and $SnO_2$.

Further, in order to improve the resistance to photo-induced degradation of the filler layer, the filler layer may contain an appropriate photo stabilizer in addition to the above described UV absorber.

Further in addition, in order to attain a further improved heat resistance and thermal processing property of the resin filler layer, the resin filler layer may contain an appropriate antioxidant.

In order for the filler layer to have an improved physical strength, it is possible to incorporate an appropriate additive such as glass single fibers or glass beads into the resin filler layer. Alternatively, it is also possible to use a glass fiber nonwoven fabric or an organic fiber nonwoven fabric during lamination of the filler layer.

Description will now be made of the surface protective film.

The surface protective film is positioned at the outermost surface of the solar cell module and because of this, it is required to excel in transparency, weatherability, water repellency, heat resistance, pollution resistance, and physical strength. As for the water repellency, it is preferably at least 50° or more preferably at least 70° in terms of contact angle of water. Therefore, the surface protective film is comprised of a highly transparent resin such as fluororesin and silicone resin. Of these, the fluororesin is the most appropriate. Specific examples of the fluororesin are ethylene-tetrafluoroethylene copolymer (EFTE), poly(chlorotrifluoroethylene) resin (PCTFE), tetrafluoroethylene-perfluoroalkylvinylether copolymer (PFA), terafluoroethylene-hexafluoropropylene copolymer (FEP), vinylidene fluoride, and vinyl fluoride resin.

In order to attain a further improvement in the adhesion of the surface protective film with the filler layer, the surface of the surface protective film to be in contact with the filler layer is desired to be subjected to surface treatment. The surface treatment can include corona discharging treatment, plasma treatment, ozone treatment, and primer coating. Of these, the corona discharging treatment is the most appropriate because a high speed can be attained while using a relatively simple apparatus.

In the following, description will be made of a process for the production of a solar cell module according to the present invention using the foregoing photovoltaic element, surface side covering material, and back side covering material. In the present invention, the production of the solar cell is desired to be conducted by way of vacuum lamination. In order to ensure the formation of a skin layer, it is desired to enclose the photovoltaic element by way of face-up lamination. The face-up lamination herein means a laminating method of enclosing the photovoltaic element while its light receiving face faces upward. On the other hand, a lamination method of enclosing the photovoltaic element while its light receiving face faces downward is called face-down lamination.

Now, the gas generated from the foaming agent when the unfoamed layer is foamed moves in the upward direction and because of this, the amount of the resin on the rear side of the photovoltaic element is increased to readily cause the formation of the skin layer.

Particularly, in the face-up lamination, a release member is placed on a metal plate made of, for instance, aluminum which is provided with an O-ring, then the foregoing back side covering material, the foregoing photovoltaic element, and the foregoing surface side covering material are stacked in the named order on the release member, and a rubber sheet having a good release property is placed over the stacked body to seal the stacked body between the metal plate and the rubber sheet while using the O-ring (the resultant will be hereinafter referred to as air back system). Thereafter, the interior space of the air back system containing the stacked body between the metal plate and the rubber sheet is evacuated to a predetermined vacuum degree by means of a vacuum pump. Then, under reduced pressure, the stacked body thus vacuum-treated in the air back system is introduced into an oven maintained at a temperature of, for instance, 80° to 200° C. which is suitable for bonding the surface side covering material and the back side covering material to the photovoltaic element so that the photovoltaic element is covered by the surface side covering material and the back side covering material, wherein the stacked body is subjected to heat treatment for a predetermined period of time. And still under reduced pressure, the stacked body is cooled. Thus there is obtained a solar cell module.

In the present invention, it is desired to conduct the foregoing edge sealing in order to prevent the gas, which is generated from the foaming agent when the unfoamed material layer is foamed, from leaking to the outside.

In the production process according to the present invention, such air back system as above-described is employed in the thermocompression treatment. In the method of using such air back system, as apparent from the above description, the back side covering material, photovoltaic element and surface side covering material are stacked to obtain a stacked body, the resultant stacked body is evacuated to remove the air present therein, and the vacuum-treated stacked body is heated while being compressed through the air back system. However, in the above thermocompression treatment, the unfoamed material layer is converted into a foamed material due to the gas generated from the foaming agent contained in the unfoamed material layer and because of this, it is necessary for the gas generated from the foaming agent during the thermocompression treatment to remain in order to efficiently foam the unfoamed material layer. For this purpose, as previously described, the edge sealing is effective.

In the above, it is necessary to prevent the gas from leaking to the outside through the release member. For this purpose, it is desired for the release member to have a nitrogen permeability of $1.0\times10^4$ $cm^3/(m^2.24h.atm)$ or less and a heat resistance such that the release member is not melted at the temperature employed in the thermocompression treatment in order to maintain the edge seal.

Such release member can include metallic members having a releasing property and a melting point of more than 150° C. and which satisfy the above conditions.

In the present invention, in order to attain a substantially smooth surface for the resulting solar cell module, it is possible to use a rigid plate. That is, when the vacuum lamination (that is, the thermocompression treatment) is conducted by way of the face-up manner, the foregoing rubber sheet follows the irregularities at the light receiving surface of the photovoltaic element to cause the resulting solar cell module to have irregularities on the surface thereof. Further, in the case where the photovoltaic element is flexible, the back side covering material follows the irregularities due to the wiring or by-pass diode at the rear face of the photovoltaic element to deform the resulting solar cell module. In order to prevent the occurrence of these problems, it is desired to dispose said rigid plate on the surface of the surface side covering material. Specifically, the rigid plate is disposed on the foregoing stacked body comprising the back side covering material, photovoltaic element and surface side covering material stacked in the named order on the release member.

In the present invention, it is possible to conduct embossing of the surface of the stacked body. The embossing may be conducted by introducing the stacked body into an oven or by heating the stacked body using a metal plate provided with a heater therein. The conditions relating to heating speed and maximum temperature in the embossing should be determined depending on the crosslinking ability of the resin used in the surface side covering material and back side covering material and the viscosity of the resin when fused.

Further, in the present invention, the decomposition temperature of the foaming agent contained in the unfoamed material layer is strongly related to the conditions of heating speed and maximum temperature during the embossing.

Figure 4A:
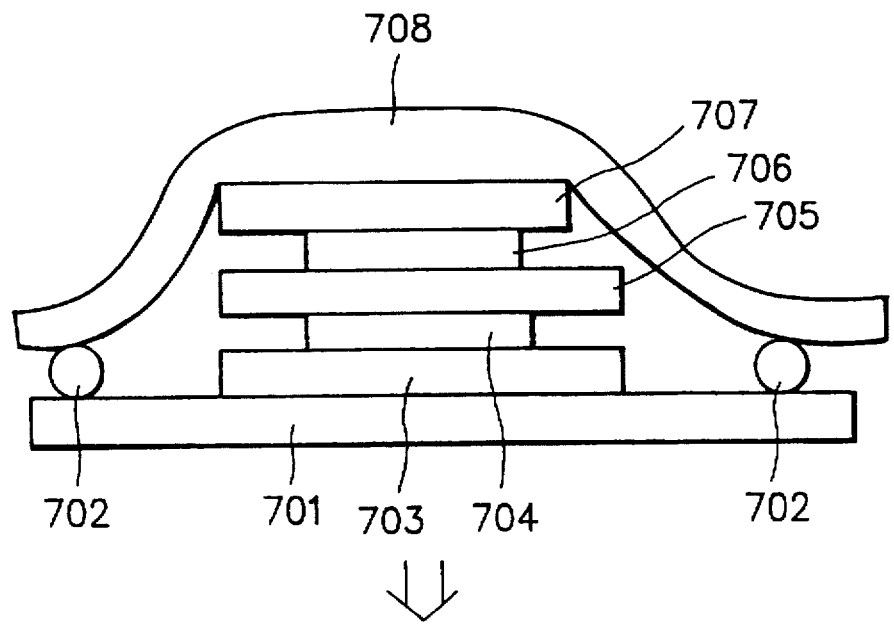
FIGS. 4(a) and 4(b) are schematic views illustrating an example of a lamination process employed in the present invention.

In the following, description will be made of the edge sealing process in order to efficiently foam the unfoamed material layer in the vacuum lamination, using a vacuum laminator of a single vacuum chamber system type shown in FIGS. 4(A) and 4(B).

First, on an aluminum plate 701 provided with an O-ring 702, a release member 703 as a constituent of the laminator is placed. On the release member 703, there are stacked an unfoamed material layer 704, a composite 705 comprising a lower adhesive layer, an insulating material layer and an upper adhesive layer, a photovoltaic element 706 and a front surface covering material 707 in the named order to form a stacked body. (The stacked body herein may have a support member on its rear side). Then, a silicone rubber sheet as a flexible member 708 is placed over the stacked body on the aluminum plate 701 while hermetically sealing between the aluminum plate 701 and the flexible member 708 by means of the O-ring 702 (see FIG. 6(A)). In this case, each of the release member 703 and the composite 705 (and also the support member (not shown in the figures) in the case where it is provided) is necessary to be greater than the unfoamed material layer 704 in terms of size, as shown in FIG. 4(A).

Figure 4B:
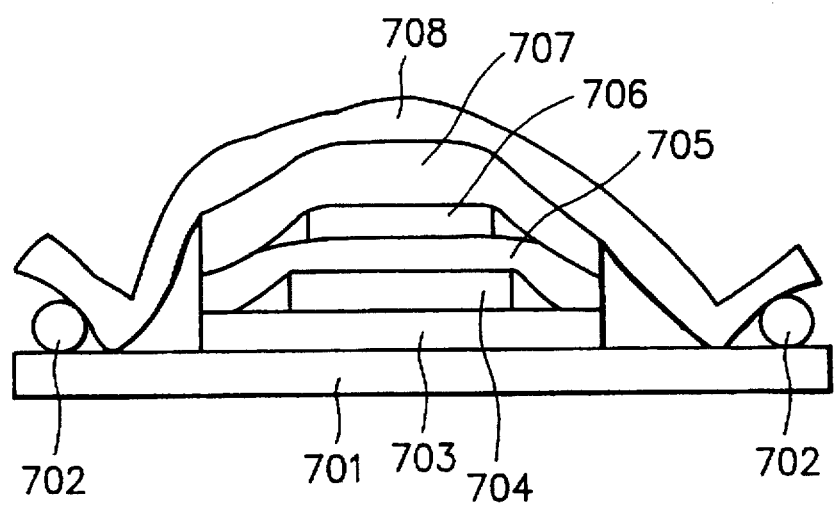

Thereafter, in a first step, the interior space containing the stacked body between the flexible member 708 and the aluminum plate 701 is exhausted to a predetermined vacuum degree by means of a vacuum pump (not shown), whereby the flexible member 708 is urged toward the aluminum plate 701 to thereby compress the stacked body, whereby the composite 705 contacts the release member 703 such that the unfoamed material layer 704 is enclosed between the release member 703 and the composite 705 as shown in FIG. 4(B).

Then, in a second step, an electric heater (not shown) installed in the aluminum plate 701 is energized to heat the stacked body to a predetermined temperature, whereby the foaming agent contained in the unfoamed material layer 704 is decomposed to generate gas, thereby causing foaming in the unfoamed material layer 704. In this case, the gas generated is efficiently utilized in foaming the unfoamed material layer 704 without leaking to the outside because the unfoamed material layer 704 is desirably enclosed by the release member 703 and the composite 705. Thus, the unfoamed material layer 704 is effectively converted into a foamed material layer. There is thus obtained a solar cell module according to the present invention. By the way, when the size of each of the release member 703 and the composite 705 is the same as that of the unfoamed material later 704, formation of a practically acceptable foamed material layer can be attained. But the expansion ratio in this case is inferior to that in the above edge sealing case.

In the following, detailed embodiments of a solar cell module in which a material comprising a foamed material and a fiber is used in the present invention with reference to examples which are not intended to restrict the scope of the present invention.

EXAMPLE 1

Figure 5:
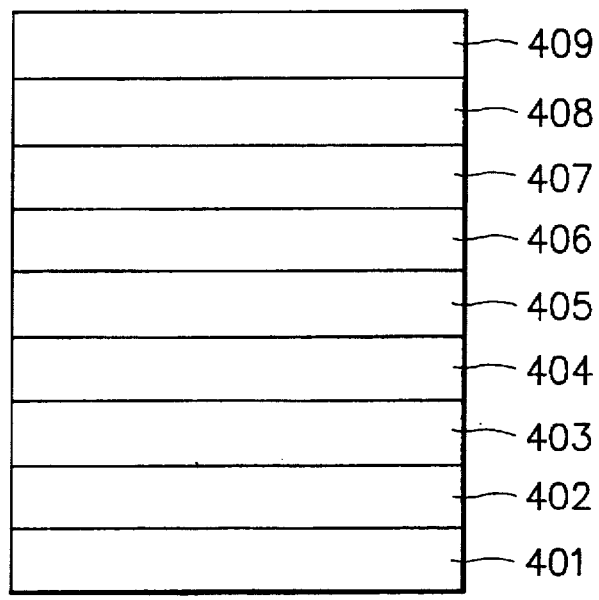
FIG. 5 is a schematic cross-sectional view illustrating a further example of a solar cell module according to the present invention.

In this example, there was prepared a solar cell module having the configuration shown in FIG. 5 which comprises a stacked body comprising a fiber member 401, an unfoamed material layer 402 (which will be eventually converted into a foamed material layer), a lower adhesive layer 403, an insulating material layer 404, an upper adhesive layer 405, a solar cell 406 (or a photovoltaic element), a reinforcing member 407, a filler layer 408 (comprising an adhesive material), and a surface protective layer 409 laminated in the named order.

The solar cell module having the configuration shown in FIG. 5 was prepared in the following manner.

1. As the fiber member 401, there was provided a nonwoven polypropylene fiber member.
2. As the unfoamed material layer 402, there was provided an unfoamed material sheet prepared in the following manner:

100 parts by weight of an ethylene-vinyl acetate resin (vinyl acetate content: 15 wt. %, melt flow rate: 9 dg/min.), 40 parts by weight of a precipitated calcium carbonate (primary particle size: about 3 µm) as a nucleus material, 5 parts by weight of a mixture composed of azodicarbonamide and dinitrosopentamethylenetetramine as a foaming agent, 1 part by weight of dicumylperoxide as a crosslinking agent, 0.5 part by weight of stearic acid, and 0.1 part by weight of carbon black as a pigment were well mixed, followed by subjecting to sheet forming treatment using a reverse L-letter type four-roll calendar, to thereby obtain an unfoamed material sheet having a thickness of 1.0 mm used as the unfoamed material layer 402.

3. As each of the lower adhesive layer 403, the upper adhesive layer 405, and the filler layer 408, there was provided a resin sheet prepared in the following manner:

That is, 100 parts by weight of an ethylene-vinyl acetate resin (vinyl acetate content: 33 wt. %, melt flow rate: 30 dg/min.), 1.5 parts by weight of 2,5-dimethyl-2,5-bis(t-butylperoxy)hexane as a crosslinking agent, 0.3 part by weight of 2-hydroxy-4-n-octoxybenzophenone as an UV absorber, 0.2 part by weight of tris(mono-nonylphenyl) phosphate as an antioxidant, and 0.1 part by weight of (2,2,6,6-tetramethyl-4-piperidyl)sebacate as a photo stabilizer were well mixed to obtain a composition. The composition thus obtained was subjected to T-die extrusion, to thereby obtain a 460 µm thick resin sheet.

In this way, there were obtained three resin sheets having a thickness of 460/µm used as the lower adhesive layer 403, the upper adhesive layer 405, and the filler layer 408.

Particularly, the resin sheet used as the lower adhesive layer 403, was made to have a size as much as 20 cm greater than that of the unfoamed material layer 402 in terms of the length of each edge.

As for the resin sheet used as the filler layer 408, its surface to be contacted with the reinforcing member 407 was subjected to corona discharge treatment.

4. As the insulating material layer 404, there was provided a 50 µm thick biaxially oriented polyethylene terephthalate (PET) film having opposite surfaces subject to corona discharge treatment and having a size which as much as 20 cm greater than that of the unfoamed material layer 402 in terms of the length of each edge.

5. As the solar cell 406, there was provided a solar cell prepared in the following manner.

Figure 6A:
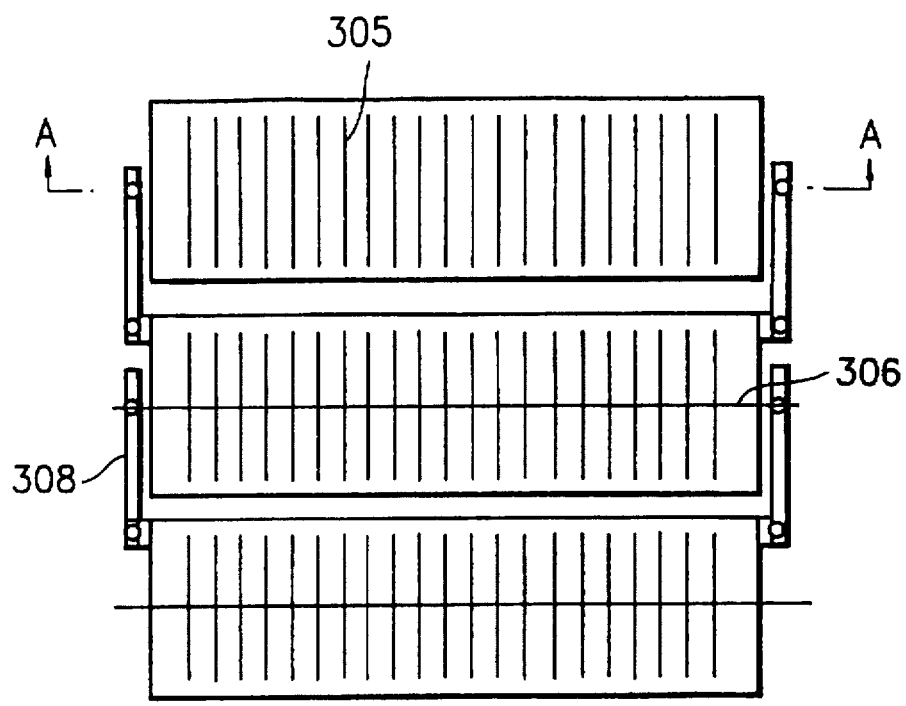
FIG. 6(A) is a schematic plan view of another example of a photovoltaic element (a solar cell) used in the present invention.
Figure 6B:
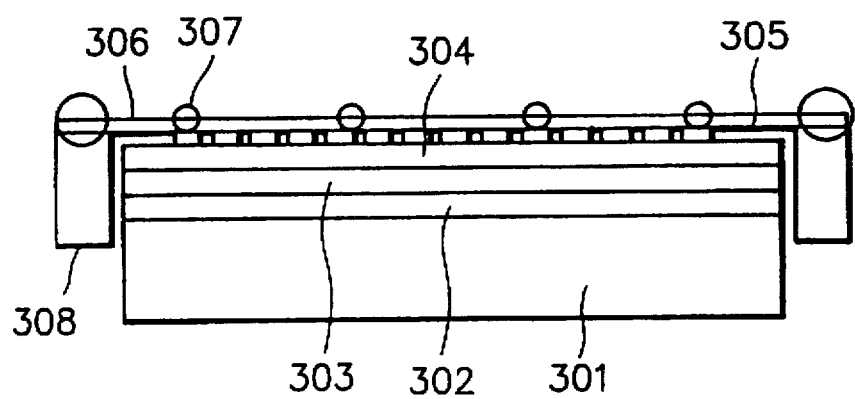
FIG. 6(B) is a schematic cross-sectional view, taken along the line A—A in FIG. 6(A).
Figure 7:
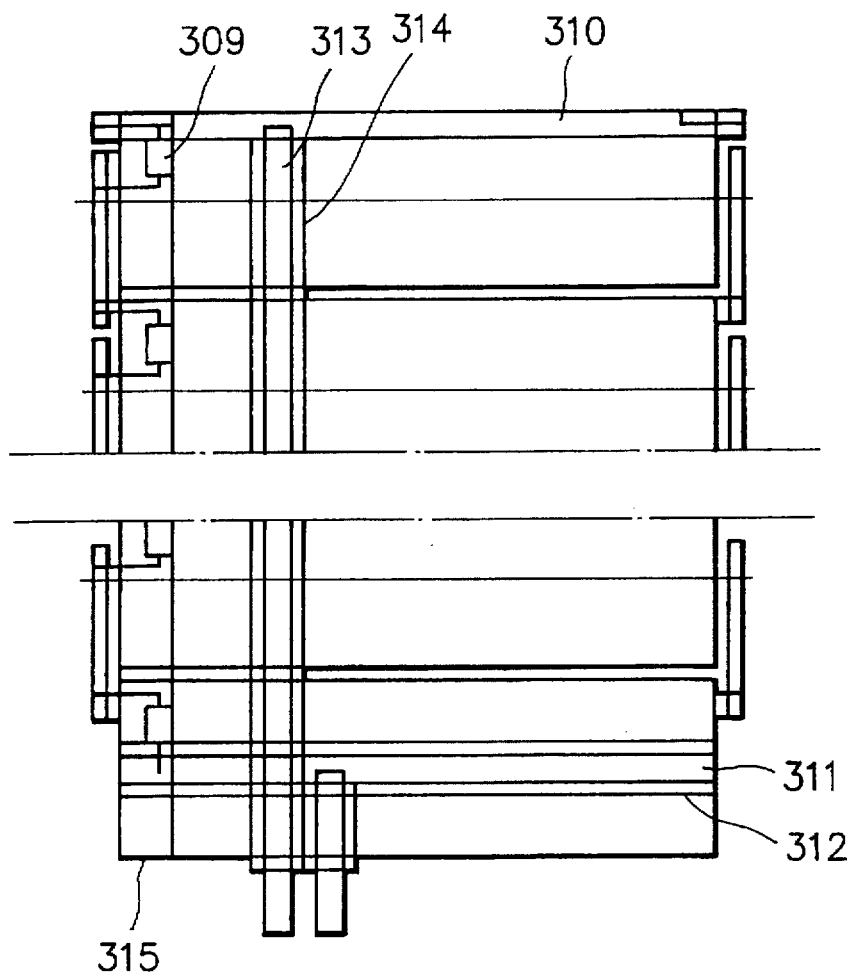
FIG. 7 is a schematic view illustrating the rear face of the photovoltaic element shown in FIG. 6(A).

That is, there was prepared a solar cell having the configuration shown in FIGS. 6(A), 6(B), and 7 which comprises a plurality of photovoltaic elements integrated in series connection. Herein, FIG. 6(A) is a schematic plan view of the solar cell, FIG. 6(B) is a schematic cross-sectional view, taken along the line A—A in FIG. 6(A), and FIG. 7 is a schematic view illustrating the backface of the solar cell.

There was firstly provided a well-cleaned stainless steel plate as a substrate 301. On the substrate 301, there was formed a two-layered back reflecting layer 302 comprising a 5000 Å thick Al film and a 5000 Å thick ZnO film by means of a conventional sputtering process, followed by forming, on the back reflecting layer 302, a tandem type a-Si photoelectric conversion semiconductor layer 303 with a nip/nip structure comprising a 150 Å thick n-type layer/a 4000 Å thick i-type layer/a 100 Å thick p-type layer/a 100 Å thick n-type layer/a 800 Å thick i-type layer/a 100 Å thick p-type layer laminated in the named order from the substrate side by means of a conventional plasma CVD method, wherein an n-type a-Si film as each n-type layer was formed from a mixture of $SiH_4$ gas, $PH_3$ gas and $H_2$ gas; an i-type a-Si film as each i-type layer was formed from a mixture of $SiH_4$ gas and $H_2$ gas; and a p-type µc-Si film as each p-type layer was formed from a mixture of $SiH_4$ gas, $BF_3$ gas and $H_2$ gas. Then, on the semiconductor layer 303, there was formed a 700 Å thick $In_2O_3$ film as a transparent conductive layer 304 by means of a conventional heat resistance evaporation process wherein an In-source was evaporated in an 02 atmosphere. The resultant was cut into a plurality of elements having a size of 30 cm×9 cm. From the plurality of elements obtained, 13 elements were randomly selected.

As for each of these 13 elements, a plurality of collecting grid electrodes 305 were formed by screen-printing an Ag-paste (No. 5007, produced by Du Pont Company) on the transparent conductive layer 304. The grid electrodes 305 thus formed on the transparent conductive layer 304 were connected by bonding a wire bus bar 306 (comprising a solder-plated copper wire of 400 um in diameter) to the grid electrodes 305 using an Ag-paste 307 (No. 220, produced by Amicon Company). As for the resultant, a copper tab 308 having a thickness of 100 um was fixed to the substrate 301 by means of spot welding. Thus, there were obtained 13 photovoltaic elements.

The resultant 13 photovoltaic elements were integrated in series connection by connecting the copper tab 308 of one of the photovoltaic element with the wire bus bar 306 of the other photovoltaic element using a solder. Then, on the rear face of each photovoltaic element, a by-pass diode 309 of 2.5 mm in diameter was fixed using an insulating tape 315 of 140 µm in thickness (comprising a 100 µm thick polyethylene terephthalate film having a 40 µm thick adhesive layer formed thereon), and the by-pass diode 309 was connected to a positive terminal and a negative terminal of the photovoltaic element using a solder.

The same insulating tape was bonded over the by-pass diode. Thereafter, to the photovoltaic element situated on one end side, a negative power output copper tab 310 of 100 µm in thickness was fixed using a double-coated tape of 65 µm in thickness, and a positive power output copper tab 311 of 100 µm in thickness was fixed to the photovoltaic element situated on the other end side using an insulating tape 312 of 140 µm in thickness (comprising a 100 µm thick polyethylene terephthalate film having a 40 µm thick adhesive layer formed thereon). To the negative power output copper tab 310, the copper tab 308 of the photovoltaic element having the negative power output copper tab 310 fixed thereto was connected using a solder. To the positive power output copper tab 311, the wire bus bar 306 of the photovoltaic element having the positive power output copper tab 311 fixed thereto was connected by turning up said wire bus bar and fixing it to the positive power output copper tab using a solder.

In order to attain a single end power output system, the negative power output copper tab 310 was extended by soldering a copper tab 313 thereto to establish a projected negative power output terminal, and the copper tab 313 was bonded onto all the photovoltaic elements using an insulating tape 314 of 140 µm in thickness (comprising a 100 µm thick polyethylene terephthalate film having a 40 µm thick adhesive layer formed thereon). As for the positive power output copper tab 311, it was formed into a projected positive power output terminal in the same manner.

Thus, there was obtained a solar cell used as the solar cell 406.

6. As the reinforcing member 407, there was provided a nonwoven glass fiber member (linear diameter: 10 µm, weighing capacity: 80 g/m$^2$).

7. As the surface protective layer 409, there was provided a 50 µm thick nonoriented ethylene-tetrafluoroethylene copolymer (ETFE) film.

8. Preparation of a solar cell module:

On a surface of an aluminum plate of 10 mm in thickness, a composite comprising a steel member having an ETFE film of 200 µm in thickness laminated thereon as a release member was placed. Then, on the aluminum plate having the release member thereon, there were stacked the nonwoven polypropylene fiber member as the fiber member 401, the unfoamed material sheet as the unfoamed material layer 402, the resin sheet as the lower adhesive layer 403, the PET film as the insulating material layer 404, the resin sheet as the upper adhesive layer 405, the solar cell as the solar cell 406, the nonwoven glass fiber member as the reinforcing member 407, the resin sheet as the filler layer 408, and the ETFE film as the surface protective layer 409 in the named order to form a stacked body. Successively, there were superposed a steel plate of 0.8 mm in thickness and a heat resistant silicone rubber sheet of 3 mm in thickness in the named order on the stacked body so as to enclose the stacked body. And the interior space containing the stacked body between the aluminum plate and the steel plate having the silicone rubber sheet superposed thereon was sealed using an O-ring (the body thus established will be referred to herein as a lamination instrument). Then, using a vacuum pump, said space containing the stacked body was evacuated so that the pressure in the interior space of the stacked body became 10 mmHg. After the inside of the stacked body was sufficiently evacuated, the lamination instrument was introduced for 65 minutes into a direct drying apparatus maintained at 180° C. while continuing the evacuating operation. Thereafter, while still continuing the evacuating operation, the lamination instrument was taken out from the drying equipment, followed by cooling to room temperature.

Thereafter, the interior pressure of the lamination instrument was returned to atmospheric pressure to obtain a vacuum-treated stacked body as a solar cell module. The unfoamed material layer 402 was converted into a foamed layer having a thickness of 5.0 mm.

The above procedures were repeated to obtain a plurality of solar cell modules.

Evaluation

Using the resultant solar cell modules, evaluation was conducted with respect to initial exterior appearance, endurance against changes in environmental temperature and humidity, and cushioning property.

The results obtained are shown in Table 1.

The evaluation of each of the above items was conducted in the following manner.

(1) Evaluation of the initial exterior appearance:

The solar cell module was optically observed. The observed result is shown in Table 1 based on the following criteria:

⊚: a case wherein no peeling of the surface side covering material, residual air bubbles therein, recesses at the foamed material layer, and protrusion at the foamed material layer generated due to the irregularities present at the rear face of the solar cell is observed;

○: a case wherein a practically negligible small protrusion at the foamed material layer generated due to the irregularities present at the rear face of the solar cell is observed; and X: a case wherein defects such as layer separation in the surface side covering material, residual air bubbles, recesses in the foamed material layer, and protrusions in the foamed material layer generated due to the irregularities present at the rear face of the solar cell are observed.

(2) Evaluation of the endurance against changes in environmental temperature and humidity:

The solar cell module was subjected to 200 repetitions of a cycle of exposure to an atmosphere of −40° C. for an hour and exposure to an atmosphere of 85° C./85% RH for four hours 200 times, and thereafter, its exterior appearance was optically observed. The observed result is shown in Table 1 based on the following criteria:

⊚: a case where no change is observed in the exterior appearance;

○: a case where a slight change is observed in the exterior appearance but is not problematic in practice, slight internal layer separation is recognized by way of finger touch, or slight internal separation is observed for the first time when the solar cell module is destructured; and X: a case where practically problematic peeling is observed at the exterior.

3) Evaluation of the cushioning property:

Considering a situation where the solar cell module is placed on a sandy surface and is stepped on, the solar cell module was subjected to load testing in the following manner. That is, sand having a maximum particle size of about 3 mm and an average particle size of 1 mm was placed on the ground, the solar cell module was placed thereon, and a weight of 60 Kg having a size of 10 cm×10 cm was placed on the solar cell module for 10 minutes. Thereafter, the exterior appearance of the solar cell module was optically observed. Then, the solar cell module was subjected to high-voltage dielectric breakdown testing in the following manner. That is, as for the solar cell module having subjected to the above load test, the positive electrode and the negative electrode were short-circuited, followed by immersing in a solution containing 0.1 wt. % of a surface active agent TRITON X-100 (trademark name, produced by Rohm & Haas Company) and having an electrical conductivity of more than 3500 ohm.cm, wherein a portion of the solar cell module to which the above load was applied was immersed in the solution without immersing its power output terminals therein. And a negative electrode from a power source was fixed to the solution side and a positive electrode from said power source was fixed to the power output terminal. Thereafter, the power source was switched on to supply a voltage of 2000 V, whereby the leakage current was examined.

The evaluated results obtained are shown in Table 1 based on the following criteria:

⊚: a case wherein neither change in the exterior appearance nor deformation in the covering material are observed, and the leakage current is less than 0.5/μA;

○: a case wherein a slight change in the exterior and a slight deformation in the covering material are observed but they are not problematic in practice, and the leakage current is less tan 0.5 μA; and X: a case wherein an apparent change in the exterior and an apparent deformation in the covering material are observed, and the leakage current is beyond 0.5 μA.

EXAMPLE 2

The procedures of Example 1 were repeated, except that the unfoamed material sheet was replaced by an unfoamed material sheet having a thickness of 1.5 mm prepared in accordance with the procedures for the preparation of the unfoamed material layer in Example 1 except for not using a crosslinking agent, to thereby obtain a plurality of solar cell modules. The resulting foamed material layer was found to have a thickness of 4.5 mm.

Using the resultant solar cell modules, evaluation was conducted in the same manner as in Example 1.

The results obtained are shown in Table 1.

EXAMPLE 3

The procedures of Example 1 were repeated, except that the crosslinking agent contained in the resin sheet as the lower adhesive layer 403 was excluded, to thereby obtain a plurality of solar cell modules. The foamed material layer was found to have a thickness of 4.4 mm.

Using the resultant solar cell modules, evaluation was conducted in the same manner as in Example 1.

The results obtained are shown in Table 1.

EXAMPLE 4

The procedures of Example 1 were repeated, except that the fiber member 401 was not used and the unfoamed material sheet used as the unfoamed material layer 402 was replaced by an unfoamed material sheet containing a fiber which was prepared by a method described below, to thereby obtain a plurality of solar cell modules.

The above fiber-containing unfoamed material sheet was prepared in the following manner. That is, 100 parts by weight of an ethylene-vinyl acetate resin (vinyl acetate content: 15 wt. %, melt flow rate: 9 dg/min.), 15 parts by weight of a glass fiber (length: 25 mm, linear diameter: 10 μm), 40 parts by weight of a precipitated calcium carbonate (primary particle size: about 3 μm) as a nucleus material, 5 parts by weight of a mixture composed of azodicarbonamide and dinitrosopentamethylenetetramine as a foaming agent, 1 part by weight of dicumylperoxide as a crosslinking agent, 0.5 part by weight of stearic acid, and 0.1 part by weight of carbon black as a pigment were well mixed, followed by subjecting to sheet forming treatment using a reverse L-letter type four-roll calendar, to thereby obtain an unfoamed material sheet having a thickness of 1.0 mm to be used as the unfoamed material layer 402.

The resulting foamed material layer was found to have a thickness of 4.2 mm.

Using the resultant solar cell modules, evaluation was conducted in the same manner as in Example 1.

The results obtained are shown in Table 1.

Reference Example 1

Figure 8:
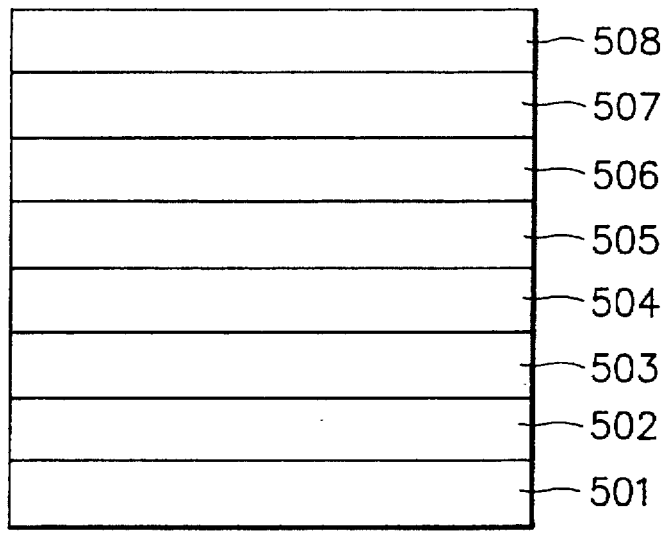
FIG. 8 is a schematic cross-sectional view of a solar cell module produced in Reference Example 1, which will be later described.

In this reference example, there was prepared a solar cell module having the configuration show in FIG. 8, which comprises a stacked body comprising a foamed material layer 501, a lower adhesive layer 502, an insulating material layer 503, an upper adhesive layer 504, a solar cell 505 (or a photovoltaic element), a reinforcing member 506, a filler layer 507 (comprising an adhesive material), and a front surface protective layer 508 laminated in the named order.

First, in the same manner as Example 1, there were provided a biaxially oriented PET film as the insulating material layer 503, a resin sheet as the upper adhesive layer 504, a solar cell as the solar cell 505, a nonwoven glass fiber member as the reinforcing member 506, a resin sheet as the filler layer 507, and a nonoriented ETFE film as the front surface protective layer 508.

Separately, there was provided a foamed polyethylene sheet used as the foamed material layer 501. And for the lower adhesive layer 502, there was prepared a resin composition in accordance with the method employed in the preparation of the resin sheet in Example 1.

Then, on a surface of an aluminum plate of 20 mm thickness which is provided with a heater therein, there are laminated the PET film as the insulating material layer 503, the resin sheet as the upper adhesive layer 504, the solar cell as the solar cell 505, the nonwoven glass fiber member as the reinforcing member 506, the resin sheet as the filler layer 507, and the ETFE film as the surface protective layer 508 in the named order to form a stacked body.

Successively, there was superposed a heat resistant silicone rubber sheet of 3 mm in thickness on the stacked body so as to enclose the stacked body. And the interim space containing the stacked body between the aluminum plate and the silicon rubber sheet was sealed using an O-ring. Then, using a vacuum pump, said space containing the stacked body was evacuated so that the pressure inside of the stacked body was 10 mmHg. After the inside of the stacked body was sufficiently evacuated, by energizing the heater of the aluminum plate, the stacked body was heated to 150° C. and it was maintained at this temperature for 20 minutes while continuing the vacuuming operation. Thereafter, while still continuing the vacuuming operation, the stacked body was cooled to room temperature. Thereafter, the pressure of the above described interior space was returned to atmospheric pressure to obtain a vacuum-treated stacked body.

Then, the foregoing composition for the formation of the lower adhesive layer 502 was applied on the PET film as the insulating material layer 503 of the resultant stacked body by means of a conventional roll coating process, followed by drying for 10 minutes, to thereby form the lower adhesive layer 502. On the lower adhesive layer 502 thus formed, the foregoing foamed polyethylene sheet was laminated as the foamed material layer 501. Thus there was obtained a solar cell module.

The above procedures were repeated to obtain a plurality of solar cell modules.

Using the resultant solar cell modules, evaluation was conducted in the same manner as in Example 1.

The results obtained are shown in Table 1.

Reference Example 2

The procedures of Example 1 were repeated, except that the unfoamed material sheet was replaced by a 5 mm thick unfoamed chloroprene rubber sheet and the expansion ratio of the chloroprene rubber sheet was changed, to thereby obtain a plurality of solar cell modules. The resultant foamed material layer was found to have a thickness of 4.5 mm.

Using the resultant solar cell modules, evaluation was conducted in the same manner as in Example 1.

The results obtained are shown in Table 1.

Reference Example 3

The procedures of Example 1 were repeated, except that the nonwoven polypropylene fiber member 401 was not used, to thereby obtain a plurality of solar cell modules. The resulting foamed material layer was found to have a thickness of 5.0 mm.

Each of the resultant solar cell modules was found to have recesses at portions of the foamed material layer situated in the vicinity of the by-pass diodes of the solar cell. Therefore, each of the resultant solar cell modules was found to be apparently inferior in initial exterior appearance. This result is shown in Table 1.

As for the solar cell modules obtained in this reference example, no evaluation of the evaluation items described in Example 1 was conducted.

Reference Example 4

The procedures of Reference Example 1 were repeated, except that neither the foamed material layer nor the lower adhesive layer were formed, to thereby obtain a plurality of solar cell modules.

Using the resultant solar cell modules, evaluation was conducted in the same manner as in Example 1.

The results obtained are shown in Table 1.

TABLE 1

| | initial exterior appearance | endurance against changes in environmental temperature and humidity | cushioning property |
|---|---|---|---|
| Example 1 | ⊚ | ⊚ | ⊚ |
| Example 2 | ⊚ | ⊚ | ○ |
| Example 3 | ⊚ | ⊚ | ○ |
| Example 4 | ⊚ | ⊚ | ○ |
| Reference Example 1 | ○ | X | ⊚ |
| Reference Example 2 | ○ | X | ⊚ |
| Reference Example 3 | X | Not evaluated | Not evaluated |
| Reference Example 4 | ⊚ | ○ | X |

As is apparent from the results shown in Table 1, each of the solar cell modules obtained in the above examples 1 to 4 having a foamed material layer wherein the irregularities present at the rear face of the solar cell are filled is free of the occurrence of layer separation even when it is repeatedly used under severe environmental conditions with high temperature and high humidity or low temperature or with frequent changes in temperature and humidity, and in addition, it excels in portability and flexibility, and is hardly damaged even when it is placed on an irregular surface of a sandy plain, sandy beach, or the like and is stepped thereon.

EXAMPLE 5

Figure 9:
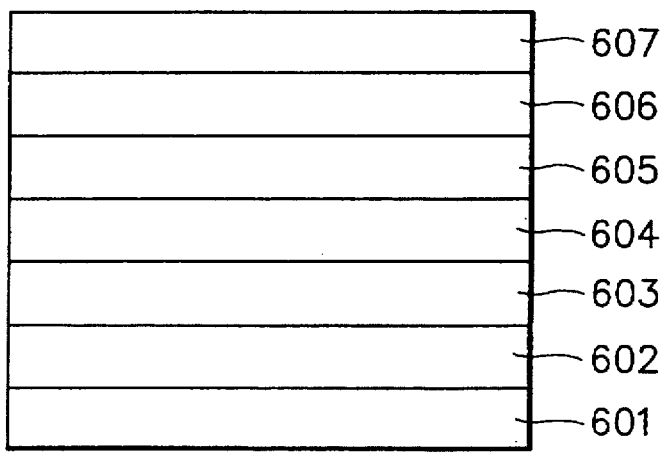
FIG. 9 is a schematic cross-sectional view illustrating a further example of a solar cell module according to the present invention.

In this example, there was prepared a solar cell module having the configuration shown in FIG. 9 which comprises a stacked body comprising a base member 601, an unfoamed material layer 602 (which will be eventually converted into a foamed material layer), an insulating material layer 603, a solar cell 604 (or a photovoltaic element), a reinforcing member 605, a filler layer 606 (comprising an adhesive material), and a surface protective layer 607 laminated in the named order.

A solar cell module having the configuration shown in FIG. 9 was prepared in the following manner.

1. As the base member 601, there was provided a Zn-plated steel plate having a thickness of 300 µm.

2. As the unfoamed material layer 602, there was provided an unfoamed material sheet having a thickness of 1.5 mm prepared in accordance with the procedures for the preparation of the unfoamed material sheet in Example 1.

3. As the insulating material layer 603, there was provided a 50 µm thick biaxially oriented polyethylene terephthalate (PET) film having opposite surfaces subjected to corona discharge treatment and having one side which is as much as 5 cm longer than the unfoamed material layer 602.

4. As the solar cell 604, there was provided a solar cell prepared in accordance with the procedures for the preparation of the solar cell in Example 1.

5. As the reinforcing member 605, there was provided a nonwoven glass fiber member (linear diameter: 10 µm, weighing capacity: 80 g/m$^2$).

6. As the filler layer 606, there was provided a 460 µm thick resin sheet which was prepared in the following manner:

100 parts by weight of an ethylene-vinyl acetate resin (vinyl acetate content: 33 wt. %, melt flow rate: 30 dg/min.), 1.5 parts by weight of 2,5-dimethyl-2,5-bis (t-butylperoxy)hexane as a crosslinking agent, 0.3 part by weight of 2-hydroxy-4-n-octoxybenzophenone as an UV absorber, 0.2 part by weight of tris (monononylphenyl)phosphate as an antioxidant, and 0.1 part by weight of (2,2,6,6-tetramethyl-4-piperidyl) sebacate as a photo stabilizer were well mixed to obtain a composition. The composition thus obtained was subjected to T-die extrusion, to thereby obtain a 460 µm thick resin sheet. 7. As the surface protective layer 607, there was provided a 50 µm thick nonoriented ethylene-tetrafluoroethylene copolymer (ETFE) film having a surface subjected to corona discharge treatment which is to contact the filler layer 606.

8. Preparation of a solar cell module:

On a surface of an aluminum plate of 10 mm in thickness, an ETFE film of 200 µm in thickness as a pollution preventive member was placed. Then, on the aluminum plate having the ETFE film thereon, there were stacked the Zn-plated steel plate as the base member 601, the unfoamed material sheet as the unfoamed material layer 602, a resin sheet (prepared in accordance with the above described procedures of forming the resin sheet used as the filler layer 606), the PET film as the insulating material layer 603, the solar cell as the solar cell 604, the nonwoven glass fiber member as the reinforcing member 605, the resin sheet as the filler layer 606, and the ETFE film as the surface protective layer 607 in the named order to form a stacked body. Then a heat resistant silicone rubber sheet of 3 mm in thickness was placed on the stacked body so as to enclose the stacked body. The interior space containing the stacked body between the aluminum plate and the silicone rubber sheet was sealed using an O-ring (the body formed herein will be referred to as a lamination instrument). Then, using a vacuum pump, said interior space containing the stacked body was evacuated so that the pressure inside of the stacked body became 10 mmHg. After the inside of the stacked body was sufficiently evacuated, the lamination instrument was introduced into a direct drying apparatus maintained at 120° C. and it was maintained for 100 minutes while continuing the vacuuming operation. Thereafter, while still continuing the vacuuming operation, the lamination instrument was taken out from the drying apparatus, followed by cooling to room temperature. Thereafter, the inside pressure of the lamination instrument was returned to atmospheric pressure to obtain a vacuum-treated stacked body as a solar cell module. The unfoamed material layer 602 was converted into a foamed layer having a thickness of 5.0 mm.

The above procedures were repeated to obtain a plurality of solar cell modules.

Evaluation

Using the resultant solar cell modules, evaluation was conducted with respect to (i) endurance against changes in environmental temperature and humidity, (ii) cushioning property, and (iii) rate of change in initial photoelectric conversion efficiency after exposure to light.

The results obtained are shown in Table 2.

The evaluation of each of the above evaluation items was conducted in the following manner:

(1) Evaluation of the endurance against changes in environmental temperature and humidity:

The evaluation of this item was conducted in the same manner as in Example 1.

The results obtained are shown in Table 2 based on the same criteria as in Example 1.

(2) Evaluation of the cushioning property:

The evaluation of this item was conducted in the same manner as in Example 1.

The results obtained are shown in Table 2 based on the same criteria as in Example 1.

(3) Evaluation of the change of rate in initial photoelectric conversion efficiency:

First, as for the solar cell module, its initial photoelectric conversion efficiency was measured. Then, the solar cell module was continuously irradiated with pseudo sunlight of 1.5 AM to deteriorate the photoelectric conversion efficiency until it became substantially constant at a given value. Thereafter, its photoelectric conversion efficiency was measured. The results are shown in Table 2 as a value relative to the initial photoelectric conversion efficiency, which is set at 1.

EXAMPLE 6

The procedures of Example 5 were repeated, except that the Zn-plated steel plate as the base member 601 was replaced by a 150 µm thick low-density polyethylene (LDPE) film containing 10 wt. % of titanium oxide and 0.2 wt. % of carbon black, to thereby obtain a plurality of solar cell modules. The foamed material layer was found to have a thickness of 3.8 mm.

Using the resultant solar cell modules, evaluation was conducted with respect to (i) endurance against changes in environmental temperature and humidity, (ii) cushioning property, and (iii) rate of change in initial photoelectric conversion efficiency after exposure to light. The evaluation of each of the items (i) and (ii) was conducted in the same manner as in Example 1. The evaluation of item (iii) was conducted in the same manner as in Example 5.

The results obtained are shown in Table 2.

EXAMPLE 7

The procedures of Example 5 were repeated, except that the base member was not used, to thereby obtain a plurality of solar cell modules. The foamed material layer was found to have a thickness of 3.6 mm.

Using the resultant solar cell modules, evaluation was conducted with respect to (i) endurance against changes in environmental temperature and humidity, (ii) cushioning property, and (iii) rate of change in initial photoelectric conversion efficiency after exposure to light.

The evaluation of each of items (i) and (ii) was conducted in the same manner as in Example 1. The evaluation of item (iii) was conducted in the same manner as in Example 5.

The results obtained are shown in Table 2.

EXAMPLE 8

The procedures of Example 5 were repeated, except that the unfoamed material sheet as the unfoamed material layer 602 was replaced by two unfoamed material sheets of 1.5 mm in thickness obtained by repeating the procedures for the formation of the unfoamed material sheet in Example 5 except no crosslinking agent was used, to thereby obtain a plurality of solar cell modules. The foamed material layer was found to have a thickness of 4.2 mm.

Using the resultant solar cell modules, evaluation was conducted with respect to (i) endurance against changes in environmental temperature and humidity, and (ii) rate of change in initial photoelectric conversion efficiency after exposure to light.

The evaluation of items (i) was conducted in the manner as in Example 1. The evaluation of item (ii) was conducted in the same manner as in Example 5.

The results obtained are shown in Table 2.

EXAMPLE 9

The procedures of Example 6 were repeated, except that the Zn-plated steel plate as the base member 601, the unfoamed material sheet as the unfoamed material layer 602, and the PET film as the insulating material layer 603 were of the same size in terms of the length of the corresponding edge, to thereby obtain a plurality of solar cell modules. The foamed material layer was found to have a thickness of 3.4 mm.

Using the resultant solar cell modules, evaluation was conducted with respect to (i) endurance against changes in environmental temperature and humidity, (ii) cushioning property, and (iii) rate of change in initial photoelectric conversion efficiency after exposure to light.

The evaluation of items (i) and (ii) was conducted in the manner as in Example 1. The evaluation of item (iii) was conducted in the same manner as in Example 5.

The results obtained are shown in Table 2.

EXAMPLE 10

The procedures of Example 5 were repeated, except that the thermocompression bonding of the stacked body was conducted using an apparatus capable of conducting thermocompression treatment under atmospheric pressure and which is provided with a press cylinder provided with a flexible sheet comprising a silicone rubber, wherein the stacked body was subjected to thermocompression treatment at 150° C. under pressure condition of 1 Kg/cm$^2$ for 20 minutes, to thereby obtain a plurality of solar cell modules. The foamed material layer was found to have a thickness of 2.8 mm.

Using the resultant solar cell modules, evaluation was conducted with respect to (i) endurance against changes in environmental temperature and humidity, and (ii) rate of change in initial photoelectric conversion efficiency after exposure to light.

The evaluation of item (i) was conducted in the manner as in Example 1. The evaluation of item (ii) was conducted in the same manner as in Example 5.

The results obtained are shown in Table 2.

Reference Example 5

Figure 10:
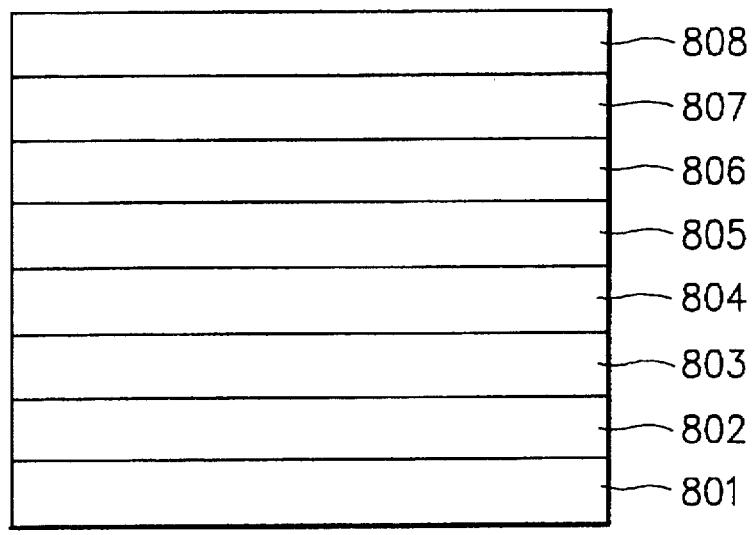
FIG. 10 is a schematic cross-sectional view of a solar cell module produced in Reference Example 5, which will be later described.

In this reference example, there was prepared a solar cell module having the configuration shown in FIG. 10, which comprises a stacked body comprising a foamed material layer 801, an adhesive layer 802, a lower reinforcing member 803, an insulating material layer 804, a solar cell 805 (or a photovoltaic element), an upper reinforcing member 806, a filler layer 807 (comprising an adhesive material), and a surface protective layer 808 laminated in the named order.

A solar cell module having the configuration shown in FIG. 10 was prepared in the following manner.

1. As the foamed material layer 801, there was provided a foamed polystyrene sheet having a thickness of 5 mm.
2. As the adhesive layer 802, there was provided an acrylic emulsion adhesive.
3. As the lower reinforcing member 803, there was provided a Zn-plated steel plate having a thickness of 300 µm.
4. As the insulating material layer 804, there was provided a 50 µm thick biaxially oriented polyethylene terephthalate (PET) film having opposite surfaces subjected corona discharge treatment.
5. As the solar cell 805, there was provided a solar cell prepared in accordance with the procedures for the preparation of the solar cell in Example 1.
6. As the upper reinforcing member 806, there was provided a nonwoven glass fiber member (linear diameter: 10 µm, weighing capacity: 80 g/m$^2$).
7. As the filler layer 807, there was provided a 460 µm thick resin sheet prepared in accordance with the procedures for the preparation of the resin sheet used as the filler layer in Example 5.
8. As the surface protective layer 808, there was provided a 50 µm thick nonoriented ethylene-tetrafluoroethylene copolymer (ETFE) film having a surface subjected to corona which is to contact with the filler layer 807 subjected to corona discharge treatment.
9. Preparation of a solar cell module:

On a surface of an aluminum plate of 10 mm in thickness which is provided with a heater, there were stacked the Zn-plated steel plate as the lower reinforcing member 803, the PET film as the insulating material layer 804, the solar cell as the solar cell 805, the nonwoven glass fiber member as the upper reinforcing member 806, the resin sheet as the filler layer 807, and the ETFE film as the surface protective layer 808 in the named order to form a stacked body.

Next, a heat resistant silicone rubber sheet of 3 mm in thickness was placed on the stacked body so as to enclose the stacked body. The interior space containing the stacked body between the aluminum plate and the silicone rubber sheet was sealed using an O-ring. Then, using a vacuum pump, said interior space containing the stacked body was evacuated so that the pressure inside of the stacked body became 10 mmHg. After the inside of the stacked body was sufficiently vacuumed, by energizing the heater of the aluminum plate, the stacked body was heated to 150° C. and maintained at this temperature for 20 minutes while continuing the vacuuming operation. Thereafter, while still continuing the vacuuming operation, the stacked body was cooled to room temperature. Thereafter, the inside pressure of the above described space was returned to atmospheric pressure to obtain a vacuum-treated stacked body.

Then, the foregoing acrylic emulsion adhesive was applied on the Zn-plated steel plate as the lower reinforcing member 803 of the stacked body by means of a conventional roll coating process, followed by drying for 10 minutes, to thereby form a layer as the adhesive layer 802. Next, on the adhesive layer 802 thus formed, the foregoing foamed polystyrene sheet was laminated to form a layer as the foamed material layer 801. Thus, there was obtained a solar cell module.

The above procedures were repeated to obtain a plurality of solar cell modules.

Using the resultant solar cell modules, evaluation was conducted with respect to (i) endurance against changes in environmental temperature and humidity, and (ii) rate of change in initial photoelectric conversion efficiency after exposure to light.

The evaluation of items (i) was conducted in the manner as in Example 1. The evaluation of item (ii) was conducted in the same manner as in Example 5.

The results obtained are shown in Table 2.

Reference Example 6

Figure 11:
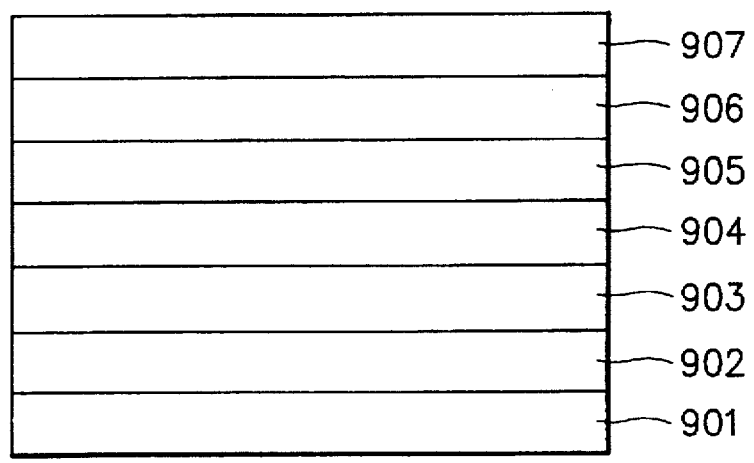
FIG. 11 is a schematic cross-sectional view of a solar cell module produced in Reference Example 6, which will be later described.

In this reference example, there was prepared a solar cell module having the configuration shown in FIG. 11 which comprises a stacked body comprising a foamed material layer 901, an adhesive layer 902, an insulating material layer 903, a solar cell 904 (or a photovoltaic element), a reinforcing member 905, a filler layer 906 (comprising an adhesive material), and a surface protective layer 907 laminated in the named order.

A solar cell module having the configuration shown in FIG. 11 was prepared in the following manner:

1. As the foamed material layer 901, there was provided a foamed polyethylene sheet having a thickness of 4 mm.
2. As the adhesive layer 902, there was provided an acrylic emulsion adhesive.
3. As the insulating material layer 903, there was provided a 50 μm thick biaxially oriented polyethylene terephthalate (PET) film having opposite surfaces subjected to corona discharge treatment.
4. As the solar cell 904, there was provided a solar cell prepared in accordance with the procedures for the preparation of the solar cell in Example 1.
5. As the reinforcing member 905, there was provided a nonwoven glass fiber member (linear diameter: 10 μm, weighing capacity: 80 g/m²).
6. As the filler layer 906, there was provided a 460 μm thick resin sheet prepared in accordance with the procedures for the preparation of the resin sheet used as the filler layer in Example 5.
7. As the surface protective layer 907, there was provided a 50 μm thick nonoriented ethylene-tetrafluoroethylene copolymer (ETFE) film having a surface which is to be contacted with the filler layer 906 subjected to corona discharge treatment.

8. Preparation of a solar cell module:

On a surface of an aluminum plate of 10 mm in thickness which is provided with a heater, there were stacked the PET film as the insulating material layer 903, the solar cell as the solar cell 904, the nonwoven glass fiber member as the reinforcing member 905, the resin sheet as the filler layer 906, and the ETFE film as the surface protective layer 907 in the named order to form a stacked body.

Then, a heat resistant silicone rubber sheet of 3 mm in thickness was placed on the stacked body so as to enclose the stacked body. The interior space containing the stacked body between the aluminum plate and the silicone rubber sheet was sealed using an O-ring. Then, using a vacuum pump, said interior space containing the stacked body was evacuated so that the pressure inside of the stacked body became 10 mmHg. After the inside of the stacked body was sufficiently vacuumed, by energizing the heater of the aluminum plate, the stacked body was heated to 150° C. and maintained at this temperature for 20 minutes while continuing the vacuuming operation. Thereafter, while still continuing the vacuuming operation, the stacked body was cooled to room temperature. Thereafter, the pressure of the above described interior space was returned to atmospheric pressure to obtain a vacuum-treated stacked body.

Then, the foregoing acrylic emulsion adhesive was applied on the PET film as the insulating material layer 903 of the stacked body by means of a conventional roll coating process, followed by drying for 10 minutes, to thereby form a layer as the adhesive layer 902. Then, on the adhesive layer 902 thus formed, the foregoing foamed polyethylene sheet was laminated to form a layer as the foamed material layer 901. Thus, there was obtained a solar cell module.

The above procedures were repeated to obtain a plurality of solar cell modules.

Using the resultant solar cell modules, evaluation was conducted with respect to (i) endurance against changes in environmental temperature and humidity, (ii) cushioning property, and (iii) rate of change in initial photoelectric conversion efficiency after exposure to light.

The evaluation of each of items (i) and (ii) was conducted in the manner as in Example 1. The evaluation of the item (iii) was conducted in the same manner as in Example 5.

The results obtained are shown in Table 2.

Reference Example 7

The procedures of Reference Example 6 were repeated, except that the foamed polyethylene sheet used as the foamed material layer before the lamination thereof to the adhesive layer was treated by subjecting it to 10 repetitions of a cycle of exposure to an atmosphere of 80° C. for four hours and exposure to an atmosphere of 40° C. for an hour 10 times, to thereby obtain a plurality of solar cell modules.

The foamed polyethylene sheet treated as described above was found to have a thickness of 4 mm which is the same as that of the starting foamed polyethylene sheet.

Using the resultant solar cell modules, evaluation was conducted with respect to (i) endurance against changes in environmental temperature and humidity, (ii) cushioning property, and (iii) rate of change in initial photoelectric conversion efficiency after exposure to light.

The evaluation of each of items (i) and (ii) was conducted in the manner as in Example 1. The evaluation of item (iii) was conducted in the same manner as in Example 5.

The results obtained are shown in Table 2.

Reference Example 8

The procedures of Reference Example 5 were repeated, except that neither the foamed material layer nor the adhesive layer were used, to thereby obtain a plurality of solar cell modules.

Using the resultant solar cell modules, evaluation was conducted with respect to (i) endurance against changes in environmental temperature and humidity, and (ii) rate of change in initial photoelectric conversion efficiency after exposure to light.

The evaluation of the item (i) was conducted in the manner as in Example 1. The evaluation of the item (ii) was conducted in the same manner as in Example 5.

The results obtained are shown in Table 2.

Reference Example 9

The procedures of Reference Example 6 were repeated, except that neither the foamed material layer nor the adhesive layer were used, to thereby obtain a plurality of solar cell modules.

Using the resultant solar cell modules, evaluation was conducted with respect to (i) endurance against changes in environmental temperature and humidity, (ii) cushioning property, and (iii) rate of change in initial photoelectric conversion efficiency after exposure to light.

The evaluation of each of items (i) and (ii) was conducted in the manner as in Example 1. The evaluation of item (iii) was conducted in the same manner as in Example 5.

The results obtained are shown in Table 2.

TABLE 2

| | endurance against changes in environmental temperature and humidity | cushioning property | change of rate in initial photoelectric conversion efficiency |
|---|---|---|---|
| Example 5 | ⊙ | not evaluated | 89 |
| Example 6 | ⊙ | ⊙ | 89 |
| Example 7 | ⊙ | ⊙ | 89 |
| Example 8 | ⊙ | not evaluated | 88 |
| Example 9 | ⊙ | ⊙ | 88 |
| Example 10 | ⊙ | not evaluated | 87 |
| Reference Example 5 | X | not evaluated | 84 |
| Reference Example 6 | X | o | 86 |
| Reference Example 7 | X | o | 86 |
| Reference Example 8 | o | not evaluated | 80 |
| Reference Example 9 | o | X | 80 |

As is apparent from the results shown in Table 2, the following facts are understood. That is, such of the solar cell modules obtained in the above examples 5 to 10 (belonging to the present invention) having a specific foamed material layer in which the irregularities present at the rear face of the solar cell are filled is free of the occurrence of layer separation even when it is repeatedly used under severe environmental conditions with high temperature and high humidity or low temperature or with frequent changes in temperature and humidity, and in addition, it excels in portability and flexibility, and it is hardly damaged even when it is placed on an irregular surface of a sandy plain, sandy beach, or the like and is stepped thereon. Further, because each of the solar cell modules of the present invention has the specific foamed material layer exhibiting an excellent adiathermic performance, it excels in endurance against high temperature and is low in light deterioration and therefore, it always stably exhibits a satisfactory photoelectric conversion efficiency even when it is permanently placed outdoors. Further in addition, because the formation of the foamed layer is conducted by way of foaming a unfoamed material during the thermocompression treatment of a stacked body having said unfoamed material therein, the production of a solar cell module can be accomplished in a reduced period of time, and therefore, the production cost of a solar cell module can be diminished.

Now, it is considered that a solar cell module having such back side covering material provided with the specific foamed material layer might have an occasion wherein the foamed material layer is deformed due to heat contraction or the like because of changes in environmental temperature. In order to prevent occurrence of this problem, it is desirable that the back side covering material of the solar cell module be designed such that it is hardly deformed wherever the solar cell module is used.

In the following, description will be made about this feature with reference to FIG. 12.

Figure 12:
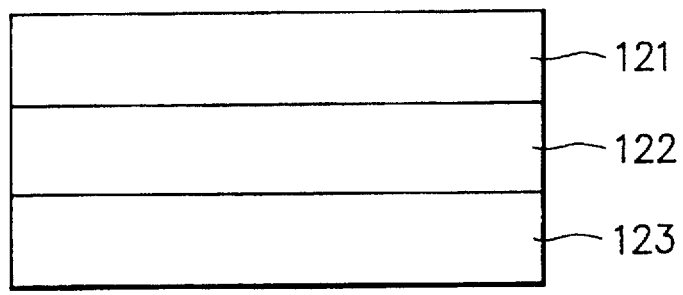
FIG. 12 is a schematic cross-sectional view of a solar cell module used for explanatory purposes.

FIG. 12 is a schematic cross-sectional view illustrating the constitution of an example of a solar cell module according to the present invention. In FIG. 12, reference numeral 122 indicates a photovoltaic element, reference numeral 123 a front surface covering material disposed to cover the light receiving face of the photovoltaic element 122, and reference numeral 121 a back side covering material disposed to cover the rear face of the photovoltaic element 122.

In the present invention, the back side covering material 121 to be designed such that it deforms at a deformation proportion of 5 to 75% in terms of the layer thickness when a load of 2 Kg/cm$^2$ is applied thereon at room temperature. The deformation proportion herein will be hereinafter referred to as layer thickness deformation proportion.

When the layer thickness deformation proportion is less than 5%, the deformation of the back side covering material is extremely small and because of this, the back side covering material is incapable of sufficiently following the irregularities and the like present at the rear face of the photovoltaic element, whereby when a person steps on the solar cell module, there is a tendency that the external pressure caused at this time is convergently applied to the recesses of the irregularities to cause a problem in that the back side covering material is damaged or the photovoltaic element is damaged. On the other hand, when the layer thickness deformation proportion is greater than 75%, the back side covering material too closely follows the irregularities and the like present at the rear face of the photovoltaic element so as to cause problems in that portions of the back side covering material situated in the recesses of the irregularities are undesirably thinned such that the back side covering material does not exhibit a sufficient protective ability and because of this, it is necessary to excessively thicken the back side covering material in order for the back side covering material to exhibit sufficient protective performance.

As for the back side covering material 121, as previously described, it may comprise a single layer or a stacked structure comprising a plurality of layers. Particularly, in the case of a solar cell module having a photovoltaic element provided with an electrically conductive substrate, when the back side covering material is disposed to cover the rear face side of the photovoltaic element by way of deformation of the back side covering material, it is desired for the back side covering material be designed such that it comprises a stacked structure comprising, for example, an adhesive layer and a protective resin layer laminated in the named order from the photovoltaic element side so that the back side covering material can function to sufficiently electrically isolate the electrically conductive substrate of the photovoltaic element while attaining a sufficient adhesion between the back side covering material and the photovoltaic element.

The above protective resin layer principally serves to protect the photovoltaic element when it is deformed. The protective resin layer corresponds the foregoing foamed material layer according to the present invention. In order for the protective resin layer to exhibit the above function of protecting the photovoltaic element during deformation, the protective resin layer may be composed of a resin which is low in hardness. Such resin can include ethylene-vinyl acetate copolymer, polyethylene, polypropylene, polyester, chloroprene, rubber sheets such as SBR rubber sheet, and extended (or foamed) materials of these.

In order to diminish the amount of a hard resin layer used and also in order to lighten the obtained solar cell, it is desired to use a foamed material layer, particularly a foamed material layer having a glass transition temperature (Tg) of −50° to 80° C. as the protective resin layer. In a preferred embodiment, the foamed material layer is composed of a material excelling in extension in order to attain a solar cell module having sufficient flexibility.

As for the protective resin layer, it should be treated in advance so as to have a sufficient heat history. For this purpose, the protective resin layer may be annealed by means of heat energy of about 150° C. However, it is desired to make the protective resin layer have a sufficient heat history by thermocompressing it to the photovoltaic element during the lamination process of producing the solar cell module. Further, in order for the protective resin layer to have a sufficient resistance to solvents, it is possible for the protective resin layer to have a film or sheet which is high in resistance to solvents.

As for the solar cell module shown in FIG. 12, the detailed constitution of the photovoltaic element and surface side covering material and the process of making the solar cell module are as previously described.

In the following, detailed embodiments of solar cell modules of the present invention configured such that they have resistance against various external factors including external pressure, impacts, and the like are described with reference to examples which are not intended to restrict the scope of the present invention.

EXAMPLE 11

Figure 13:
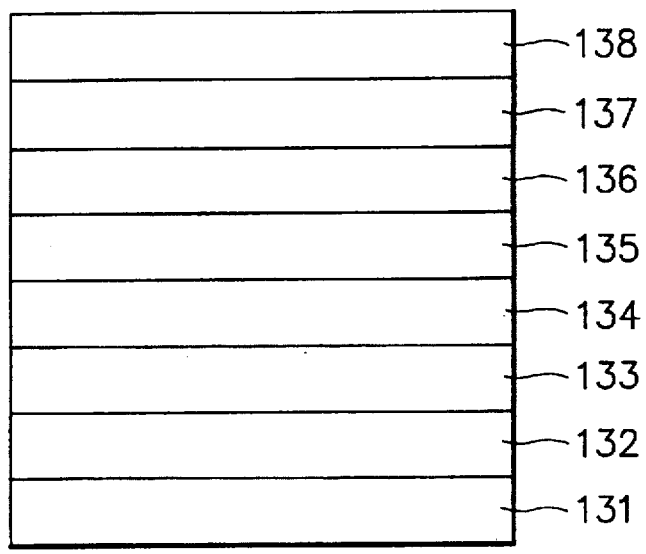
FIG. 13 is a schematic cross-sectional view illustrating a further example of a solar cell module according to the present invention.

In this example, there was prepared a solar cell module having the configuration shown in FIG. 13 which comprises a stacked body comprising a back side protective layer 131, a first adhesive layer 132, an insulating layer 133, a second adhesive layer 134, a photovoltaic element (a solar cell) 135, a reinforcing member 136, a third adhesive layer 137, and a surface protective layer 138 laminated in the named order.

A solar cell module having the configuration shown in FIG. 13 was prepared in the following manner.

1. As the back side protective layer 131, there was provided a foamed chloroprene sheet having a thickness of 4 mm.

2. As the first and second adhesive layers 132 and 134, there were provided two EVA sheets having a thickness of 300 μm.

3. As the insulating layer 133, there was provided a PET film having a thickness of 100 μm.

4. As the solar cell 135, there was provided a solar cell having the configuration shown in FIG. 3 which was prepared in the following manner.

That is, there was firstly provided a well-cleaned stainless steel plate as a substrate 201. On the substrate 201, there was formed a two-layered back reflecting layer 202 comprising a 5000 Å thick Al film and a 5000 Å thick ZnO film by means of a conventional sputtering process. On the back reflecting layer 202, there was formed a tandem type a-Si photoelectric conversion semiconductor layer 203 with an nip/nip structure comprising a 150 Å thick n-type layer/a 4000 Å thick i-type layer/a 100 Å thick p-type layer/a 100 Å thick n-type layer/a 800 Å thick i-type layer/a 100 Å thick p-type layer laminated in the named order from the substrate side by means a the conventional plasma CVD method, wherein an n-type a-Si film as each n-type layer was formed from a mixture of $SiH_4$ gas, $PH_3$ gas, and $H_2$ gas; an i-type a-Si film as each i-type layer was formed from a mixture of $SiH_4$ gas and $H_2$ gas; and a p-type μc-Si film as each p-type layer was formed from a mixture of $SiH_4$ gas, $BF_3$ gas, and $H_2$ gas. Then, on the semiconductor layer 203, there was formed a 700 Å thick $In_2O_3$ film as a transparent conductive layer 204 by means of a conventional heat resistance evaporation process wherein an In-source was evaporated in an $O_2$ atmosphere. The resultant was cut into a plurality of elements having a size of 30 cm×15 cm. From the plurality of elements obtained, two elements were randomly selected.

As for each of the two elements, an Ag-paste comprising powdered Ag dispersed in polyester resin (trademark name: Ag-paste No. 5007, produced by Du Pont Company) was screen-printed on the transparent conductive layer 204, followed by drying, to thereby form a grid electrode as the collecting electrode 205. Thus, there were obtained two photovoltaic elements.

The resultant two photovoltaic elements were integrated in series connection using a copper tab of 50 μm thickness and an Ag-paste (No. 220, produced by Amicon Company). A copper tab of 50 μm thickness as the negative power output terminal 206 was fixed to the substrate 201 using an Ag-paste (No. 220, produced by Amicon Company). Then, a polyamide resin film having a thickness of 50 μm (trademark name: CAPTON FILM, produced by Sumitomo 3M Kabushiki Kaisha) as the insulator 208 was disposed as shown in FIG. 3 and a copper tab of 50 μm thickness as the positive power output terminal 206a was fixed to the collecting electrode 205 using an Ag-paste (No. 220, produced by Amicon Company). Thus, there was obtained a solar cell.

5. As the reinforcing member 136, there was provided a nonwoven glass fiber member (linear diameter: 10 μm, weighing capacity: 80 g/m$^2$).

6. As the third adhesive layer 137, there was provided an EVA sheet of 460 μm thickness.

7. As the surface protective layer 138, there was provided a fluororesin film of 50 μm thickness having a surface subjected to corona discharge treatment which is to contact the third adhesive layer 137.

8. Preparation of a solar cell module:

On a surface of an aluminum plate of 20 mm thickness which is provided with a heater therein, there were stacked the foamed chloroprene sheet as the back side protective layer 131, the EVA sheet as the first adhesive layer 132, the PET film as the insulating layer 133, the EVA sheet as the second adhesive layer 134, the solar cell 135, the nonwoven glass fiber ember as the reinforcing member 136, the EVA sheet as the third adhesive layer 137, and the fluororesin film as the surface protective layer 138 in the named order to form a stacked body.

Next, a heat resistant silicone rubber sheet of 3 mm in thickness was placed on the stacked body so as to enclose the stacked body. And the interior space containing the stacked body between the aluminum plate and the silicone rubber sheet was sealed using an O-ring. Then, using a vacuum pump, said space containing the stacked body was evacuated so that the pressure inside of the stacked body became 10 mmHg. After the inside of the stacked body was sufficiently vacuumed, by energizing the heater of the aluminum plate, the stacked body was heated to 150° C. and maintained at this temperature for 20 minutes under the vacuuming operation. Thereafter, while still continuing the vacuuming operation, the stacked body was cooled to room temperature. Finally, the pressure of the above described interior space was returned to atmospheric pressure to obtain a solar cell module.

The above procedures were repeated to obtain a plurality of solar cell modules.

Evaluation

Using the resultant solar cell modules, evaluation was conducted with respect to endurance against changes in an environmental temperature, cushioning property, impact resistance, and adhesion in an environment with a high temperature and humidity.

The results obtained are shown in Table 3.

The evaluation of each of the above items was conducted in the following manner.

(1) Evaluation of the endurance against changes in environmental temperature:

The solar cell module was subjected to 50 repetitions of a cycle of exposure to an atmosphere of –40° C. for an hour and exposure to an atmosphere of 85° C. for an hour, and thereafter, its exterior appearance was optically observed. The observed results are shown in Table 3 based on the following criteria:

⊚: a case where no change is observed in the exterior appearance;

○: a case where a slight change is observed in the exterior appearance but it is not problematic in practice;

X: a case where practically problematic peeling, cracking or coloring is observed at the exterior.

(2) Evaluation of the cushioning property:

The evaluation of this item was conducted in the same manner as in Example 1.

The results obtained are shown in Table 3 based on the same criteria as in Example 1.

(3) Evaluation of the impact resistance:

The solar cell module was subjected to a hail impact test in order to examine the ability of the covering material to protect the inside of a solar cell module against external pressure and impacts. This test was conducted in the following manner. That is, ten balls of ice, each having a diameter of one inch, were made to collide at a speed of 23.2 m/sec with each portion of the solar cell module in which the physical strength is weak (the center of the solar cell, corners of the module, edges, connection portions of the solar cell). The solar cell module thus treated was optically examined in terms of the presence or absence of layer separation and cracking, and in terms of photoelectric conversion efficiency. The evaluation of the photoelectric conversion efficiency was conducted in a manner wherein the photoelectric conversion efficiencies before and after the hail impact test were measured, and the change ratio therebetween was examined.

The results obtained are shown in Table 3 based on the following criteria:

⊚: a case wherein layer separation and cracking are not observed at all, and the change ratio is less than 5%;

○: a case wherein slight layer separation and cracking are observed but the change ratio is less than 5%; and X: a case wherein layer separation and cracking are frequently observed and the change ratio is 5% or above.

(4) Evaluation of the adhesion in an environment with a high temperature and humidity:

The solar cell module was maintained in an atmosphere of 85° C./85% RH for 100 hours, and the solar cell module thus treated was subjected to a T-peel test in an atmosphere of 85° C./85% RH to examine the layer adhesion of a given end portion of the covering material of the solar cell module.

The results obtained are shown in Table 3 based on the following criteria:

⊚: a case wherein the layer adhesion is excellent.

○: a case wherein the layer adhesion is satisfactory; and

X: a case wherein the layer adhesion is insufficient.

EXAMPLE 12

The procedures of Example 11 were repeated, except that the back side protective layer 131 was comprised of a foamed polyethylene sheet having a thickness of 2 mm, and the temperature of 150° C. and the period of time of 20 minutes in the thermocompression bonding process of the stacked body were respectively changed to 80° C. and 40 minutes, to thereby obtain a plurality of solar cell modules.

Using the resultant solar cell modules, evaluation was conducted in the same manner as in Example 11.

The results obtained are shown in Table 3.

EXAMPLE 13

The procedures of Example 11 were repeated, except that the back side protective layer 131 was comprised of a urethane resin sheet having a thickness of 2 mm, to thereby obtain a plurality of solar cell modules.

Using the resultant solar cell modules, evaluation was conducted in the same manner as in Example 11. The results obtained are shown in Table 3.

EXAMPLE 14

A solar cell module having the configuration shown in FIG. 13 was prepared in the following manner.

1. As the back side protective layer 131, there was provided a sheet obtained by annealing a foamed polyethylene sheet having a thickness of 3 mm at 80° C. for an hour in a hot-air oven.

2. As the first adhesive layer 132, there was provided an acrylic emulsion adhesive.

3. As the insulating layer 133, there was provided a PET film having a thickness of 100 μm.

4. As the second adhesive layer 134, there was provided an EVA sheet having a thickness of 300 μm.

5. As the solar cell 135, there was provided a solar cell prepared in accordance with the procedures for the preparation of the solar cell in Example 11.

6. As the reinforcing member 136, there was provided a nonwoven glass fiber member (linear diameter: 10 μm, weighing capacity: 80 g/m²).
7. As the third adhesive layer 137, there was provided an EVA sheet of 460 μm thickness.
8. As the surface protective layer 138, there was provided a fluororesin film of 50 μm thickness having a surface which is to contact the third adhesive layer 137 subjected to corona discharge treatment.
8. Preparation of a solar cell module:

On a surface of an aluminum plate of 20 mm thickness which is provided with a heater therein, there were stacked the PET film as the insulating layer 133, the EVA sheet as the second adhesive layer 134, the solar cell 135, the nonwoven glass fiber member as the reinforcing member 136, the EVA sheet as the third adhesive layer 137, and the fluororesin film as the surface protective layer 138 in the named order to form a stacked body.

Next, a heat resistant silicone rubber sheet of 3 mm in thickness was placed on the stacked body so as to enclose the stacked body. The interior space containing the stacked body between the aluminum plate and the silicone rubber sheet was sealed using an O-ring. Then, using a vacuum pump, said interior space containing the stacked body was evacuated so that the pressure inside of the stacked body became 10 mmHg. After the inside of the stacked body was sufficiently vacuumed, by energizing the heater of the aluminum plate, the stacked body was heated to 150° C. and maintained at this temperature for 20 minutes while continuing the vacuuming operation. Thereafter, while still continuing the vacuuming operation, the stacked body was cooled to room temperature. Finally, the pressure of the above described interior space was returned to atmospheric pressure to obtain a vacuum-treated stacked body.

On the PET film as the insulating layer 133 of the resultant stacked body, the foregoing acrylic emulsion adhesive was applied by means of the conventional roll coating process, followed by drying for 10 minutes, to form a layer as the first adhesive layer 132. Successively, on the first adhesive layer 132 thus formed, the foregoing annealed sheet as the backside protective layer 131 was laminated. Thus, there was obtained a solar cell module.

The constitution of the covering material of the solar cell module obtained here is substantially the same as that of the solar cell module in Reference Example 1.

The above procedures were repeated to obtain a plurality of solar cell modules.

Using the resultant solar cell modules, evaluation was conducted in the same manner as in Example 11.

The results obtained are shown in Table 3.

Reference Example 10

The procedures of Example 11 were repeated, except that the insulating layer 133 and the second adhesive layer 134 were not formed, to thereby obtain a plurality of solar cell modules.

Using the resultant solar cell modules, evaluation was conducted in the same manner as in Example 11.

The results obtained are shown in Table 3.

Reference Example 11

The procedures of Example 14 were repeated, except that the foamed polyethylene sheet having a thickness of 3 mm used as the backface protective layer 131 was used without subjecting the module to the annealing treatment, to thereby obtain a plurality of solar cell modules.

Using the resultant solar cell modules, evaluation was conducted in the same manner as in Example 11.

The results obtained are shown in Table 3.

Additional Evaluation

As for each of the solar cell modules obtained in Examples 11 to 14, the layer thickness deformation proportion (in terms of the layer thickness) of the back side covering material upon the application of an external pressure was examined by applying a load of 2 Kg/cm² to the back side covering material at room temperature. As a result, the layer thickness deformation proportion was found to be 40% for the solar cell module obtained in Example 11, 15% for the solar cell module obtained in Example 12, 10% for the solar cell module obtained in Example 13, and 45% for the solar cell module obtained in Example 14.

TABLE 3

| | endurance against changes in environmental temperature | cushioning property | impact resistance | adhesion in environment with a high temperature and humidity |
|---|---|---|---|---|
| Example 11 | ⊚ | ⊚ | ⊚ | ⊚ |
| Example 12 | ⊚ | ⊚ | ⊚ | ⊚ |
| Example 13 | ⊚ | ○ | ○ | ⊚ |
| Example 14 | ○ | ⊚ | ⊚ | ○ |
| Reference Example 10 | ⊚ | x | x | ⊚ |
| Reference Example 11 | x | ⊚ | ⊚ | ○ |

Based on the results shown in Table 3 and the results described in the foregoing additional evaluation, the following facts are understood. That is, the covering material of any of the solar cell modules obtained in Examples 11 to 14 (belonging to the present invention) exhibits a desirable layer thickness deformation proportion within a specific range and excels in durability, protective ability, and adhesion even when the solar cell module is used in severe environments. On the other hand, the covering material of the solar cell module obtained in Reference Example 10 is poor in protective ability and impact resistance, and the covering material of the solar cell module obtained in Reference Example 11 is poor in durability against changes in environmental temperature.

Further, as for conventional solar modules, the environment under which they can be used is limited, but each of the solar cell modules according to the present invention has no such limitation and they can be stably and safely used under any environment.

The solar cell module according to the present invention can be widely used as a building construction member by proper design using an appropriate support member made of, for example, a metallic material.

Description will now be made of an example of using the solar cell module according to the present invention as a building construction member, specifically, as a roof member with reference to FIGS. 14 to 16.

Figure 14:
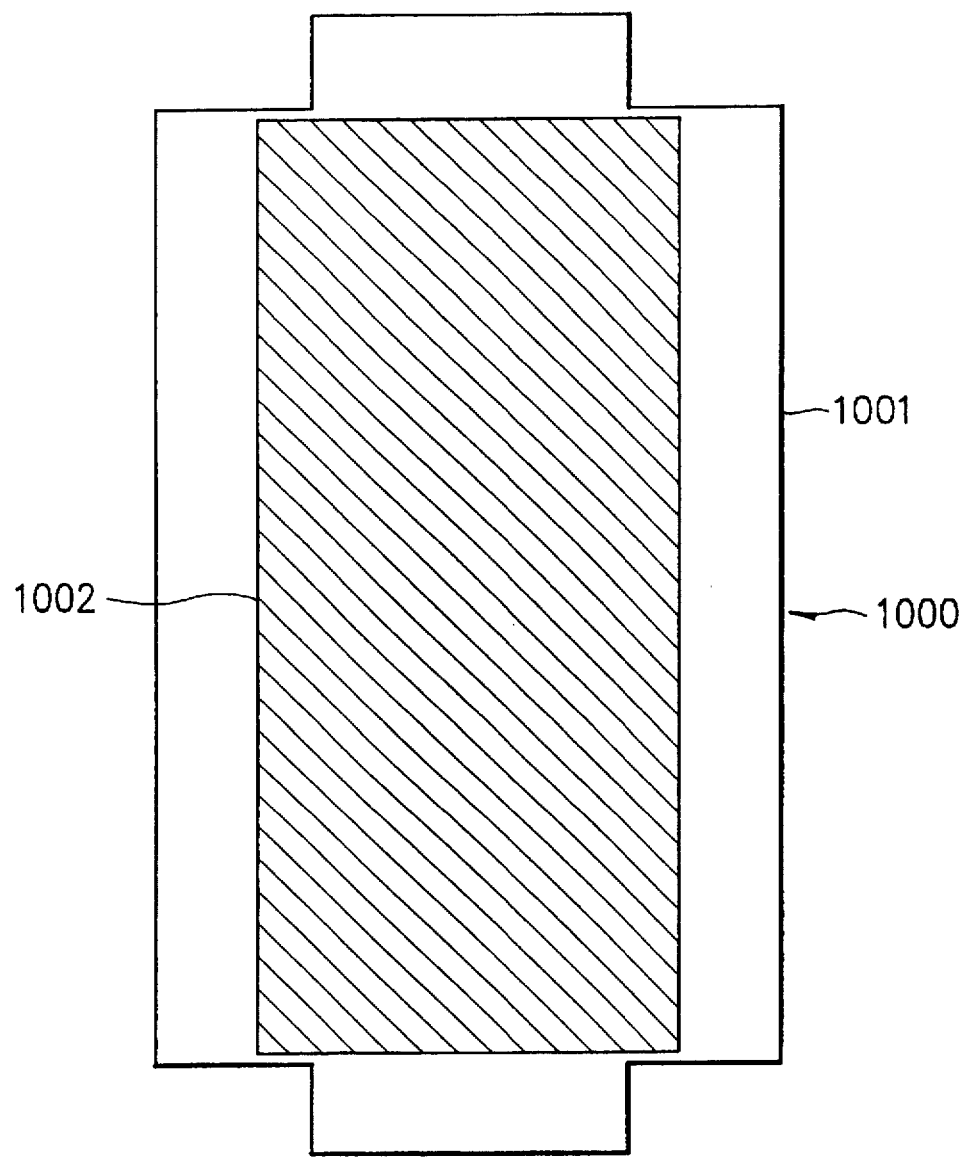
FIGS. 14 and 15 are schematic views respectively illustrating an embodiment when a solar cell module according to the present invention is used as a building construction material.

FIG. 14 is a schematic view plan illustrating an embodiment wherein the solar cell module 1000 is designed so that it can be used as a roof member. Particularly, the solar cell module 1000 comprises a solar cell 1002 comprising a photovoltaic element enclosed by a front surface covering material and a back side covering material including the foregoing formed material layer, insulating material layer and the like, which is disposed on a support member (a reinforcing member) 1001 such as a steel plate. The support member 1001 has a greater size than that of the solar cell 1002 such that it has four extended portions respectively situated outside each edge of the solar cell 1002 as shown in FIG. 14.

Figure 15:
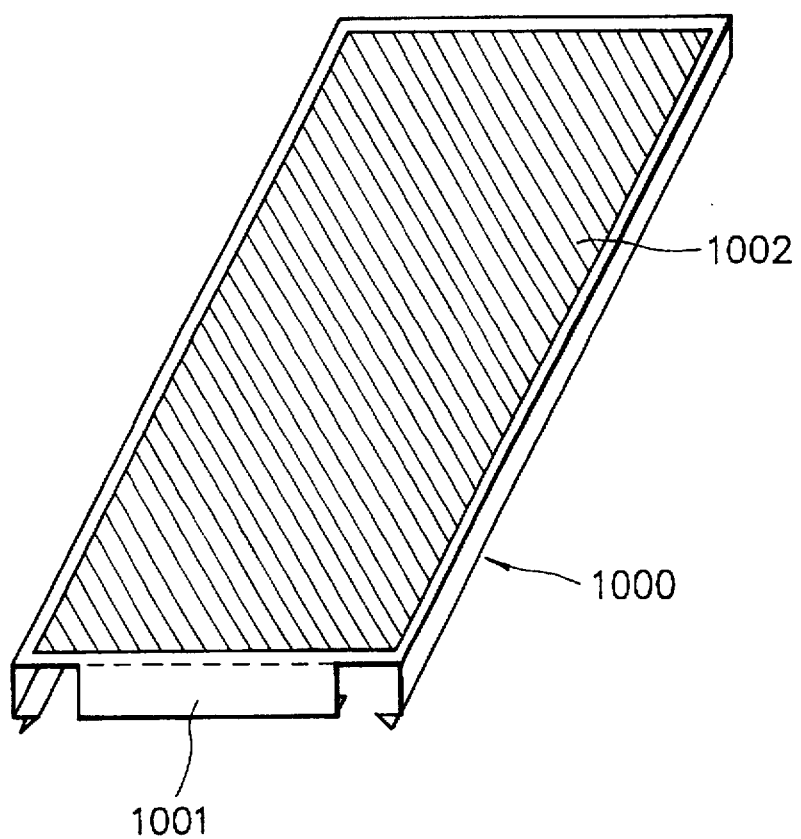

The solar cell module 1000 shown in FIG. 14 is then processed as shown in FIG. 15, wherein the four extended portions of the solar cell module 1000 are bent toward the side opposite the light receiving face of the solar cell module. The solar cell module thus configured can be used as a building construction member, specifically, as a roof member.

Figure 16A:
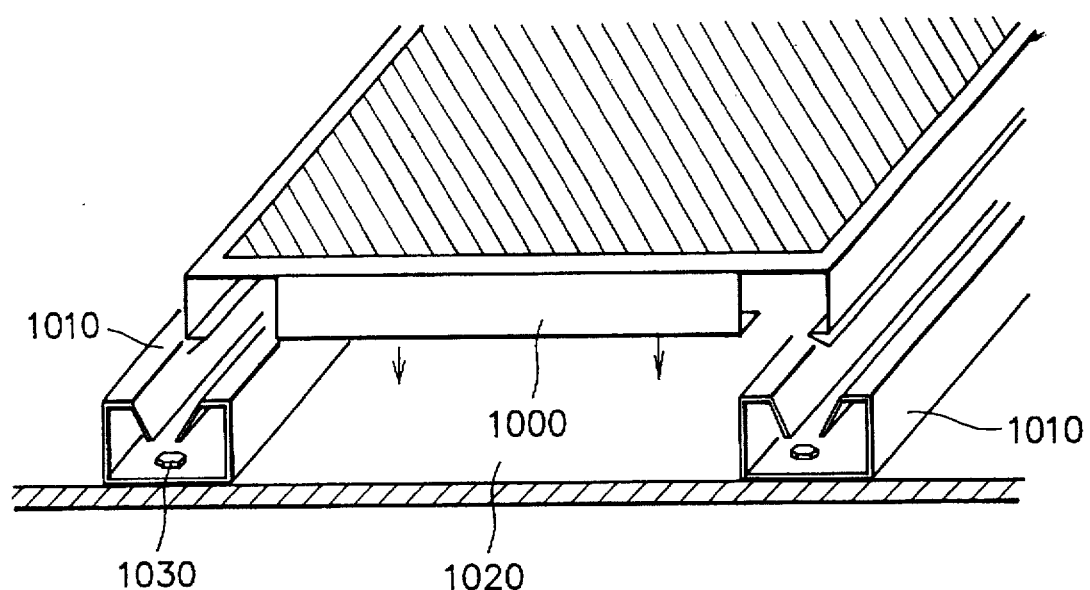
FIGS. 16(A) and 16(B) are schematic views illustrating an embodiment where a solar cell module according to the present invention is used as a roofing material of a building.
Figure 16B:
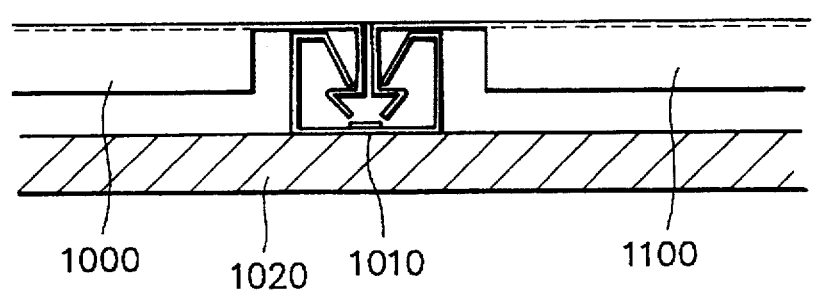

FIGS. 16(A) and 16(B) are schematic views illustrating an embodiment where the solar cell module shown in FIG. 15 is placed on a roof of a building as a roof member.

As shown in FIG. 16(A), the solar cell module 1000 is arranged on receiving members 1010 fixed to a roof plate 1020 by means of bolts 1030, and then the solar cell module is pressed from above, whereby the bent extended portions of the solar cell module are engaged in the receiving member 1010.

FIG. 16(B) is a schematic view illustrating a cross-sectional structure of a configuration wherein a plurality of solar cell modules each comprising the solar cell module shown in FIG. 15 are placed on a roof of a building, wherein adjacent extended portions of the two solar cell modules 1000 and 1100 are engaged in a common receiving member 1010.

In the following, description will be made of advantages of the present invention.

As previously described, the solar cell module has, on the side opposite the light receiving face side, the specific covering material (that is, the back side covering material) capable of deforming at a layer deformation proportion of 5 to 75% for a load of 2 Kg/cm² applied at room temperature and because of this, the photovoltaic element (the solar cell) contained in the solar cell module is always maintained in a stable state without being damaged even when the solar cell module is placed on an irregular surface of a sandy plain, sandy beach, or the like and unexpected externally applied pressure, which is caused, for instance, when the module is stepped on, is applied thereto. In addition, the back side covering material has a sufficient endurance against changes in environmental temperature and is free of the occurrence of layer separation even when the solar cell module is maintained in the environment with frequent changes in temperature over a long period of time. Particularly, the back side covering material is hardly deformed, for instance, when the temperature of the environment in which the solar cell module is maintained is changed from more than 30° C. to room temperature, the solar cell module always being maintained in a stable state without the occurrence of layer separation in the back side covering material.

Further, as previously described, because the back side covering material has the specific foamed material layer having a desirable flexibility, it is possible to reduce the amount of the hard resin layer used. This enables a lighter solar cell module to be obtained. And by making the foamed material layer to be composed of a resin having a glass transition temperature (Tg) of −50° to 80° C., the lamination process by way of thermocompression bonding can be desirably conducted without damaging the foamed material layer.

In addition, by conducting the lamination of the back side covering material to the photovoltaic element (the solar cell) by way of heat treatment and successive compression treatment, the back side covering material obtains a sufficient heat history and because of this, heat contraction or the like do not occur at the back side covering material. When the compression treatment is conducted by way of vacuum compression treatment, the size of the equipment to be used therefor can be minimized.

Further, by conducting the heat treatment in the lamination process at a temperature of 80° to 200° C., the occurrence of negative influences to the photovoltaic element (the solar cell) and the back side and front side covering materials can be minimized. In this case, by making the period of time for the heat treatment 2 hours or less, the period of time required to accomplish the lamination process can be shortened while minimizing the occurrence of negative influences to the photovoltaic element (the solar cell) and the back side and surface side covering materials due to the heat treatment.

What is claimed is:

1. A solar cell module comprising a photovoltaic element having a photoactive semiconductor layer as a photoelectric conversion member, said photovoltaic element being enclosed by a front side covering material covering a light receiving front side of said photovoltaic element and a back side covering material covering a back side of said photovoltaic element, and said back side covering material comprising a foamed material, characterized in that said foamed material comprises a member (a) selected from the group consisting of a stacked body (a-i) comprising a foamed material and a fiber and a material (a-ii) comprising a foamed material with a fiber incorporated therein.

2. A solar cell module according to claim 1, wherein the fiber is a woven fabric or a nonwoven fabric.

3. A solar cell module according to claim 1, wherein the back side covering material has a smooth surface.

4. A solar cell module according to claim 1, wherein the back side covering material has a stacked structure comprising a first adhesive layer, an insulating material layer, a second adhesive layer, and the member (a) laminated in the named order, and said second adhesive layer has a crosslinked molecular structure.

5. A solar cell module according to claim 1, wherein the foamed material of the stacked body (a-i) and the foamed material with incorporated fiber (a-ii) each has a crosslinked molecular structure.

6. A solar cell module according to claim 1, wherein the front side covering material has a front surface protective layer comprising a fluororesin.

7. A solar cell module according to claim 1, wherein the amount of the fiber contained in each of the stacked body (a-i) and the material (a-ii) is in the range of from 0.5 to 20 parts by weight versus the amount of the foamed material.

8. A solar cell module according to claim 1, wherein the foamed material of each of the stacked body (a-i) and the material (a-ii) comprises closed bubbles.

9. A solar cell module according to claim 1, wherein the back side covering material is disposed on a base member.

10. A solar cell module according to claim 9, wherein the base member is a steel plate.

11. A solar cell module according to claim 1, wherein the back side covering material comprising the member (a) has a layer thickness deformation proportion of 5 to 75% for a load of 2 Kg/cm² applied thereon at room temperature.

12. A process for producing a solar cell module comprising a photovoltaic element having a photoactive semiconductor layer as a photoelectric conversion member which is enclosed by a front side covering material covering a light receiving front side of said photovoltaic element and a back side covering material covering a back side of said photovoltaic element, said process including a step of covering the back side of said photovoltaic element with said back side covering material, said covering step comprising providing an unfoamed material containing a foaming agent therein usable as a constituent of said back side covering material, and decomposing said foaming agent contained in said unfoamed material to form a foamed material as said back side covering material.

13. The process according to claim 12, which includes a step of preventing a gas generated during the formation of the foamed material from leaking to the outside.

14. The process according to claim 12, which includes a step of forming a laminate as the back side covering material on the back side of the photovoltaic element by sequentially laminating an insulating member, the unfoamed material, and a base member in the named order on the back side of the photovoltaic element prior to the formation of the foamed material, wherein the area of each of the insulating member and the base member before forming the laminate on the back side of the photovoltaic element is greater than that of the unfoamed material.

15. The process according to claim 12, wherein the covering of the photovoltaic element by the front side covering material by the back side covering material is conducted by means of a vacuum process.

16. The process according to claim 12, which includes a step comprising providing a stacked body comprising the front side covering material, the photovoltaic element, and the back side covering material and subjecting the stacked body to a vacuum.

17. The process according to claim 16, wherein a rigid plate is disposed on the stacked body.

18. The process according to claim 12, which includes a step of laminating the back side covering material containing the unfoamed material, the photovoltaic element, and the front side covering material in the named order.

19. The process according to claim 12, wherein the back side covering material further contains a fiber.

20. The process according to claim 19, wherein the back side covering material further contains an adhesive material.

21. The process according to claim 20, which includes a step of forming a stacked body by laminating the back side covering material containing the unfoamed material and the fiber and the adhesive material, the photovoltaic element, and the front side covering material in the named order on a lamination instrument provided with a release material.

22. The process according to claim 21, wherein the stacked body formed on the lamination instrument is subjected to a vacuum while sealing the stacked body with the aid of the adhesive material, thereby obtaining a sealed stacked body and the sealed stacked body is released from the lamination instrument with the aid of the release material.

23. The process according to claim 22, wherein the release material has a nitrogen permeability of $1.0 \times 10^4$ cm$^3$/(m$^2$.24h.atm) and a surface having a melting point of 150° C. or above.

24. The process according to claim 19, which includes a step of forming a stacked body by laminating the back side covering material containing the unfoamed material and the fiber, the photovoltaic element, and the front side covering material in the named order on a lamination instrument provided with a release material.

25. A solar cell module comprising a photovoltaic element having at least one photoactive semiconductor layer as a photoelectric conversion member and having a light receiving front side and a back side opposite said light receiving front side, said photovoltaic element having a covering material on at least the back side of said photovoltaic element, characterized in that said covering material has a layer thickness deformation proportion of 5 to 75% for a load of 2 Kg/cm$^2$ applied thereto at room temperature.

26. A solar cell module according to claim 25, which is durable against changes in environmental temperature of 30° C. or above.

27. A solar cell module according to claim 25, wherein the covering material comprises a layer containing a foamed material therein.

28. A solar cell module according to claim 27, wherein the foamed material comprises a resin having a glass transition temperature (Tg) of −50° to 80° C.

29. A process for producing a solar cell module having a photovoltaic element comprising at least one photoactive semiconductor layer as a photoelectric conversion member and having a light receiving front side and a back side opposite said light receiving front side, said solar cell module having a covering layer on at least said back side to cover said back side, said process including the steps of laminating a material having a deformation proportion of 5 to 75% for a load of 2 Kg/cm$^2$ applied thereto at room temperature on said back side, subjecting the resultant to compression treatment, and subjecting to heat treatment to form said covering layer on said back side.

30. The process according to claim 29, wherein the covering layer comprises a layer containing a foamed material therein.

31. The process according to claim 30, wherein the foamed material comprises a resin having a glass transition temperature (Tg) of −50° to 80° C.

32. The process according to claim 29, wherein the heat treatment is conducted at a temperature of 80° to 200° C.

33. The process according to claim 29, wherein the heat treatment is conducted for 2 hours or less.

34. The process according to claim 29, wherein the compression treatment is conducted by applying a vacuum.

35. The process according to claim 29, wherein a material having a deformation proportion of 5 to 75% for a load of 2 Kg/cm$^2$ applied thereto at room temperature is laminated on the light receiving front side at the same time of laminating the material on the back side.

36. A building construction member having a solar cell module comprising a photovoltaic element having a photoactive semiconductor layer as a photoelectric conversion member, said photovoltaic element being enclosed by a front side covering material covering a light receiving front side of said photovoltaic element and a back side covering material covering a back side of said photovoltaic element, and said back side covering material comprising a foamed material, characterized in that said foamed material comprises a member (a) selected from the group consisting of a stacked body (a-i) comprising a foamed material and a fiber and a material (a-ii) comprising a foamed material with a fiber incorporated therein.

37. A building construction member according to claim 36, wherein the member (a) has a layer thickness deformation proportion of 5 to 75% for a load of 2 Kg/cm$^2$ applied thereto at room temperature.

38. A building construction member having a solar cell module comprising a photovoltaic element having at least one photoactive semiconductor layer as a photoelectric conversion member and having a light receiving front side and a back side opposite said light receiving front side, said photovoltaic element having a covering material on at least the back side of said photovoltaic element, characterized in that said covering material has a layer thickness deformation proportion of 5 to 75% for a load of 2 Kg/cm$^2$ applied thereto at room temperature.

39. A roof member having a solar cell module comprising a photovoltaic element having a photoactive semiconductor layer as a photoelectric conversion member, said photovoltaic element being enclosed by front side covering material covering a light receiving front side of said photovoltaic element and a back side covering material covering a back side of said photovoltaic element, and said back side covering material comprising a foamed material, characterized in that said foamed material comprises a member (a) selected from the group consisting of a stacked body (a-i) comprising a foamed material and a fiber and a material (a-ii) comprising a foamed material with a fiber incorporated therein.

40. A roof member having a solar cell module comprising a photovoltaic element having at least one photoactive semiconductor layer as a photoelectric conversion member and having a light receiving front side and a back side opposite said light receiving front side, said photovoltaic element having a covering material on at least the back side of said photovoltaic element, characterized in that said covering material has a layer thickness deformation proportion of 5 to 75% for a load of 2 Kg/cm$^2$ applied thereto at room temperature.

* * * * *

UNITED STATES PATENT AND TRADEMARK OFFICE
CERTIFICATE OF CORRECTION

PATENT NO. : 5,800,631

DATED : September 1, 1998

INVENTOR(S) : SATORU YAMADA ET AL.

It is certified that error appears in the above-identified patent and that said Letters Patent is hereby corrected as shown below:

COLUMN 1

Line 14, "surface" should read --(a "surface--; and "member" should read --member")--.
    Line 15, "a" should read --(a--; and "member" should read --member")--.

COLUMN 6

Line 50, "invention" should read --invention is--.

COLUMN 7

Line 20, "inthat" should read --in that--.
    Line 41, "FIGS. 4(a) and 4(b)" should read --FIGS. 4(A) and 4(B)--.

COLUMN 11

Line 16, "the" should read --in the--.

COLUMN 13

Line 35, "1023," should read --102B,--.

COLUMN 16

Line 24, "it" should read --it is--.

UNITED STATES PATENT AND TRADEMARK OFFICE
CERTIFICATE OF CORRECTION

PATENT NO. : 5,800,631

DATED : September 1, 1998

INVENTOR(S): SATORU YAMADA ET AL.

It is certified that error appears in the above-identified patent and that said Letters Patent is hereby corrected as shown below:

COLUMN 21

Line 16, "is occur" should read --occur--.

COLUMN 24

Line 64, "shottky-type" should read --Schottky-type--.

COLUMN 26

Line 55, "layer. The" should read --layer. ¶ The--.
    Line 56, Close up right margin.
    Line 57, Close up left margin.

COLUMN 31

Line 57, Close up right margin.
    Line 58, Close up left margin.

COLUMN 34

Line 6, ":a" should read --©:a--.

COLUMN 37

Line 44, "sheet. 7. As" should read --sheet. ¶ 7. As--.

UNITED STATES PATENT AND TRADEMARK OFFICE
CERTIFICATE OF CORRECTION

PATENT NO. : 5,800,631
DATED : September 1, 1998
INVENTOR(S) : SATORU YAMADA ET AL.

It is certified that error appears in the above-identified patent and that said Letters Patent is hereby corrected as shown below:

COLUMN 40

Line 39, "subjected" should read --subjected to--.

COLUMN 44

Line 9, "a" should read --an--.
    Line 55, "portions" should read --portion--.

UNITED STATES PATENT AND TRADEMARK OFFICE
CERTIFICATE OF CORRECTION

PATENT NO. : 5,800,631

DATED : September 1, 1998

INVENTOR(S) : SATORU YAMADA ET AL.

It is certified that error appears in the above-identified patent and that said Letters Patent is hereby corrected as shown below:

COLUMN 46

Line 20, "a the" should read --of a--.

COLUMN 47

Line 3, "ember" should read --member--.

COLUMN 55

Line 9, "front" should read --a front--.

Signed and Sealed this

Eighteenth Day of May, 1999

Attest:

Q. TODD DICKINSON

*Attesting Officer*      *Acting Commissioner of Patents and Trademarks*